United States Patent
Kim et al.

(10) Patent No.: US 10,156,759 B2
(45) Date of Patent: Dec. 18, 2018

(54) LIQUID CRYSTAL DISPLAY DEVICE

(71) Applicant: Samsung Display Co. Ltd., Yongin-si (KR)

(72) Inventors: Kwi Hyun Kim, Yongin-si (KR); Sang Yong No, Seoul (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 15/702,266

(22) Filed: Sep. 12, 2017

(65) Prior Publication Data

US 2018/0004057 A1   Jan. 4, 2018

Related U.S. Application Data

(63) Continuation of application No. 15/370,692, filed on Dec. 6, 2016, now Pat. No. 9,857,654.

(30) Foreign Application Priority Data

Apr. 4, 2016 (KR) .................. 10-2016-0041108

(51) Int. Cl.
*H01L 29/12* (2006.01)
*G02F 1/1362* (2006.01)
*H01L 51/56* (2006.01)
*H01L 27/32* (2006.01)
*G02F 1/1333* (2006.01)
*G02F 1/1335* (2006.01)
(Continued)

(52) U.S. Cl.
CPC ...... *G02F 1/136286* (2013.01); *G02F 1/1368* (2013.01); *G02F 1/13624* (2013.01); *G02F 1/133345* (2013.01); *G02F 1/133514* (2013.01); *G02F 1/134309* (2013.01); *G02F 1/136213* (2013.01); *H01L 27/326* (2013.01); *H01L 51/56* (2013.01); *H05K 999/99* (2013.01); *G02F 2001/134345* (2013.01); *G02F 2001/136218* (2013.01); *G02F 2201/123* (2013.01)

(58) Field of Classification Search
CPC ... H01L 27/326; H01L 51/56; G02F 1/13624; G02F 1/136286; G02F 1/133512
USPC .......................................................... 257/43
See application file for complete search history.

(56) References Cited

U.S. PATENT DOCUMENTS

| | | |
|---|---|---|
| 2008/0266226 A1 | 10/2008 | Park et al. |
| 2009/0190052 A1 | 7/2009 | Jung et al. |
| 2010/0060558 A1 | 3/2010 | Kim et al. |

(Continued)

OTHER PUBLICATIONS

Extended European Search Report—European Patent Application No. 17150361.8 dated May 26, 2017.

*Primary Examiner* — David S Blum
(74) *Attorney, Agent, or Firm* — Cantor Colburn LLP

(57) ABSTRACT

A liquid crystal display device includes a substrate, a first gate line, a data line, a first subpixel unit including a first switching element, and a first subpixel electrode connected with a second electrode of the first switching element, a second subpixel unit including a second switching element which includes a control electrode connected with the first gate line and a first electrode is connected with the data line, a second subpixel electrode connected with a second electrode of the second switching element, and a third switching element which includes a control electrode connected with the first gate line and a storage wiring including a first storage line, at least a part thereof overlapping the first subpixel electrode, and a second storage line, at least a part thereof overlapping the second subpixel electrode.

9 Claims, 17 Drawing Sheets

(51) Int. Cl.
    *G02F 1/1343*     (2006.01)
    *G02F 1/1368*     (2006.01)

(56) References Cited

U.S. PATENT DOCUMENTS

| | | |
|---|---|---|
| 2011/0031493 A1 | 2/2011 | Yamazaki et al. |
| 2013/0038621 A1 | 2/2013 | Choi et al. |
| 2015/0268517 A1 | 9/2015 | Song et al. |
| 2017/0110522 A1 | 4/2017 | Lee et al. |
| 2017/0115522 A1 | 4/2017 | Mun et al. |
| 2017/0123277 A1 | 5/2017 | Shin et al. |

LIQUID CRYSTAL DISPLAY DEVICE

This application is a continuation of U.S. patent application Ser. No. 15/370,692, now U.S. Pat. No. 9,857,654, filed on Dec. 6, 2016, which claims priority to Korean Patent Application No. 10-2016-5 0041108, filed on Apr. 4, 2016, and all the benefits accruing therefrom under 35 U.S.C. § 119, the content of which in its entirety is herein incorporated by reference.

BACKGROUND

1. Field

Exemplary embodiments of the invention relates to a liquid crystal display device.

2. Description of the Related Art

Importance of a display device has increased with the development of multimedia. Accordingly, various types of display devices, such as a liquid crystal display ("LCD") device, an organic light emitting display ("OLED") device, and the like, have been used.

Among the various types of display devices, the LCD device, which is one of the most widely used flat panel display devices, includes two substrates provided with field generating electrodes, such as a pixel electrode and a common electrode, and a liquid crystal layer disposed between the two substrates. The LCD device has a structure in which a voltage is applied to the field generating electrodes to generate an electric field in the liquid crystal layer, and thus a direction of liquid crystal molecules in the liquid crystal layer is determined and a polarization of incident light, thereby displaying an image.

Among various types of liquid crystal devices, a vertically aligned LCD device, in which the major axes of liquid crystal molecules are arranged in a direction perpendicular to a display panel, has been developed. The vertically aligned LCD device has been developed to have various structures including a structure in which one pixel is divided into two subpixels in order to ensure adequate side visibility.

SUMMARY

An exemplary embodiment of the invention provides a liquid crystal display ("LCD") device, which reduces the ripple of signals for voltage distribution.

Another exemplary embodiment of the invention provides an LCD device, which solves a current-resistance ("IR") drop phenomenon.

Still another exemplary embodiment of the invention provides an LCD device, which reduces horizontal cross torque.

According to exemplary embodiments of the invention, the ripple of signals for voltage distribution is reduced, and thus an IR drop phenomenon is improved.

Further, a horizontal cross torque is reduced.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of the invention discloses an LCD device including a substrate, a first gate line disposed on the substrate, a data line disposed on the first gate line, a first subpixel unit including a first switching element which includes a control electrode connected with the first gate line and a first electrode connected with the data line, and a first subpixel electrode connected with a second electrode of the first switching element, a second subpixel unit including a second switching element which includes a control electrode connected with the first gate line and a first electrode connected with the data line, a second subpixel electrode connected with a second electrode of the second switching element, and a third switching element which includes a control electrode connected with the first gate line, and a storage wiring including a first storage line, at least a part thereof overlapping the first subpixel electrode, and a second storage line, at least a part thereof overlapping the second subpixel electrode. A first electrode of the third switching element may be disposed on the different layer from that on which the first and second storage lines are disposed to be connected with both the first and second storage lines, and the second electrode of the third switching element may be connected with the second subpixel electrode.

An exemplary embodiment of the invention also discloses an LCD device including a substrate, a gate line disposed on the substrate, a data line disposed on the gate line, a storage wiring including first and second storage lines disposed on the same layer as that on which the gate line is disposed, and a third storage line disposed on the same layer as that on which the data line is disposed, and connected with both the first and second storage lines, a first subpixel unit including a first switching element connected with the gate line and the data line, and a first subpixel electrode, at least a part thereof overlapping the first storage line, and connected with the first switching element, and a second subpixel unit including a second switching element connected with the gate line and the data line, a second subpixel electrode at least a part thereof overlapping the second storage line, and connected with the second switching element, and a third switching element connected with the second subpixel electrode and the third storage line.

An LCD device including a substrate, a first gate line disposed on the substrate, a first data line disposed on the first gate line, a storage wiring including first and second storage lines disposed on the same layer as that on which the first gate line is disposed, and a third storage line disposed on the same layer as that on which the first data line is disposed, and connected with one of the first and second storage lines, a first subpixel unit including a first switching element connected with the first gate line and the first data line, and a first subpixel electrode, at least a part thereof overlapping the first storage line, and connected with the first switching element, and a second subpixel unit including a second switching element connected with the first gate line and the first data line, a second subpixel electrode, at least a part thereof overlapping the second storage line, and connected with the second switching element, and a third switching element connected with the second subpixel electrode, wherein the third storage line overlaps both the first subpixel electrode and the second subpixel electrode.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
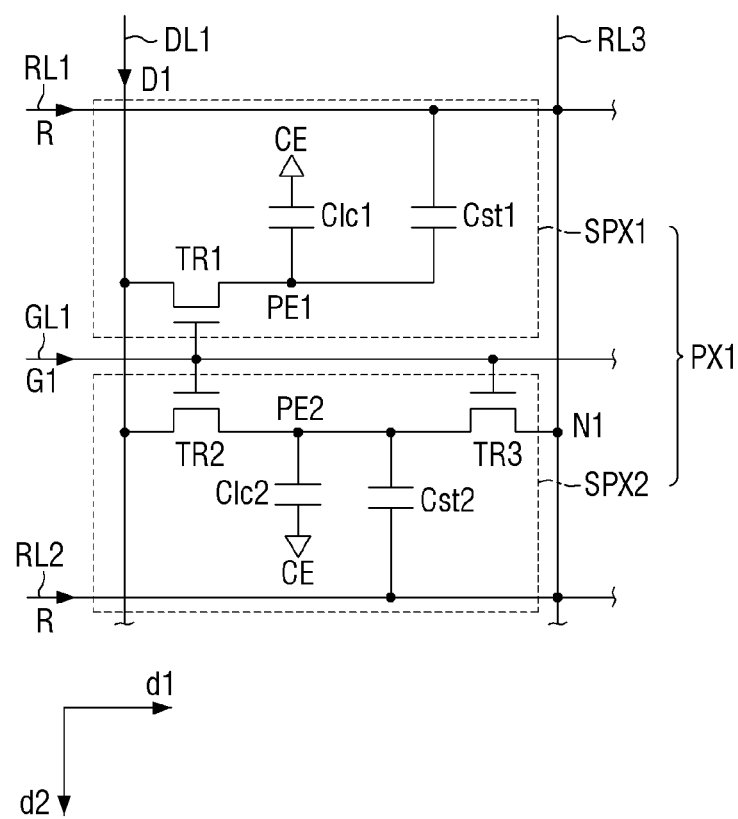
FIG. 1 is an equivalent circuit diagram illustrating an exemplary embodiment of a first pixel unit of the configuration of a liquid crystal display ("LCD") device according to the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, preferred embodiments of the invention will be described in detail with reference to the attached drawings.

FIG. 1 is an equivalent circuit diagram schematically illustrating a first pixel unit of the configuration of a liquid crystal display ("LCD") device according to an exemplary embodiment of the invention. First, a first pixel unit PX1 will be described with reference to FIG. 1.

Referring to FIG. 1, the first pixel unit PX1 may include a first subpixel unit SPX1 and a second subpixel unit SPX2.

The first pixel unit PX1 may be connected with a first gate line GL1 and a first data line DL1. The first gate line GL1 may be extended in a first direction d1. The first gate line GL1 may receive a first gate signal G1 from a gate drive unit. The first data line DL1 may be extended in a second direction d2 different from the first direction d1. The first data line DL1 may receive a first data signal D1 from a data drive unit. The first direction d1 may be vertically crossed with the second direction d2. In FIG. 1, the first direction d1 is exemplified as a row direction, and the second direction d2 is exemplified as a column direction.

The first subpixel unit SPX1 may include a first switching element TR1 and a first subpixel electrode PE1. In an exemplary embodiment, the first switching element TR1 may be a three-terminal element, such as a thin film transistor ("TFT"). The control electrode of the first switching element TR1 may be connected with the first gate line GL1, and a first electrode of the first switching element TR1 may be connected with the first data line DL1. Further, the second electrode of the first switching element TR1 may be connected with the first subpixel electrode PE1. In an exemplary embodiment, the control electrode of the first switching element TR1 may be a gate electrode, and the first electrode of the first switching element TR1 may be a source electrode, for example. In the exemplary embodiment, the second electrode of the first switching element TR1 may be a drain electrode.

The first switching element TR1 is turned on according to the first gate signal G1 received from the first gate line GL1 to provide the first data signal D1 received from the first data line DL1 to the first subpixel electrode PE1.

The first subpixel unit SPX1 may further include a first liquid crystal capacitor Clc1 disposed between the first subpixel electrode PE1 and a common electrode CE. The first liquid crystal capacitor Clc1 charges the difference voltage between a voltage provided to the first subpixel electrode PE1 and a voltage provided to the common electrode CE.

The second subpixel unit SPX2 may include a second switching element TR2, a third switching element TR3, and a second subpixel electrode PE2. In an exemplary embodiment, each of the second and third switching elements TR2 and TR3 may be a three-terminal element, such as a TFT.

The control electrode of the second switching element TR2 may be connected with the first gate line GL1, and a first electrode of the second switching element TR2 may be connected with the first data line DL1. Further, the second electrode of the second switching element TR2 may be connected with the second subpixel electrode PE2. In an exemplary embodiment, the control electrode of the second switching element TR2 may be a gate electrode, and a first electrode of the second switching element TR2 may be a source electrode, for example. In the exemplary embodiment, the second electrode of the second switching element TR2 may be a drain electrode, for example.

The second switching element TR2 is turned on according to the first gate signal G1 received from the first gate line GL1 to apply the first data signal D1 received from the first data line DL1 to the second subpixel electrode PE2.

The control electrode of the third switching element TR3 may be connected with the first gate line GL1, and a first electrode of the third switching element TR3 may be connected with a first node N1. Further, the second electrode of the third switching element TR3 may be connected with the second subpixel electrode PE2. In an exemplary embodiment, the control electrode of the third switching element TR3 may be a gate electrode, and a first electrode of the third switching element TR3 may be a source electrode. In the exemplary embodiment, the second electrode of the third switching element TR3 may be a drain electrode. The third switching element TR3 may be connected with a third storage line RL3, which will be described later, through the first node N1.

The third switching element TR3 is turned on according to the first gate signal G1 received from the first gate line GL1 to apply the storage signal S received from the third storage line RL3 to the second subpixel electrode PE2.

The second subpixel unit SPX2 may further include a second liquid crystal capacitor Clc2 disposed between the second subpixel electrode PE2 and the common electrode CE. A part of the voltage corresponding to the first data signal D1 applied to the second subpixel electrode PE2 is divided when a storage signal S is applied to the second subpixel electrode PE2. Therefore, the level of the voltage charged in the second liquid crystal capacitor Clc2 is lower than the level of the voltage charged in the first liquid crystal capacitor Clc1.

Since the level of the voltage charged in the first liquid crystal capacitor Clc1 is different from the level of the voltage charge in the second liquid crystal capacitor Clc2, the oblique angle of liquid crystal molecules of the first subpixel unit SPX1 is different from the oblique angle of liquid crystal molecules of the second subpixel unit SPX2. Therefore, the first subpixel unit SPX1 may be different from the second subpixel unit SPX2 in brightness. That is, an image viewed from a lateral side may be as close as possible to an image viewed from a front side by appropriately adjusting the voltage charged in the first liquid crystal capacitor Clc1 and the voltage charged in the second liquid crystal capacitor Clc2. Through this, the side visibility of the LCD device according to an exemplary embodiment of the invention may be improved.

A storage wiring RD (refer to FIG. 11) may include first to third storage lines RL1 to RL3. The first storage line RL1 may overlap at least a part of the first subpixel electrode PE1. The second storage line RL2 may overlap at least a part of the second subpixel electrode PE2. In an exemplary embodiment, a direct current type storage signal S may be provided to each of the first and second storage lines RL1 and RL2. The level of the voltage of the storage signal S is not particularly limited as long as the level of the voltage charged in the second liquid crystal capacitor Clc2 is lower than the level of the voltage charged in the first liquid crystal capacitor Clc1.

The first subpixel unit SPX1 may further include a first storage capacitor Cst1 provided by overlapping the first subpixel electrode PE1 and the first storage line RL1. That is, a first electrode of the first storage Cst1 may be connected with the first subpixel electrode PE1, and the second electrode of the first storage Cst1 may be connected with the first storage line RL1.

The second subpixel unit SPX2 may further include a second storage capacitor Cst2 provided by the overlapping of the second subpixel electrode PE2 and the second storage line RL2. That is, a first electrode of the second storage Cst2 may be connected with the second subpixel electrode PE2, and the second electrode of the second storage Cst2 may be connected with the second storage line RL2.

The third storage line RL3 may be connected with a first electrode of the third switching element TR3 through the first node N1. Further, the third storage line RL3 may be connected with both the first storage line RL1 and the second storage line RL2. Therefore, the third storage line RL3 may receive the storage signal S from each of the first and second storage lines RL1 and RL2. This configuration will be described in detail with reference to FIG. 2.

Figure 2:
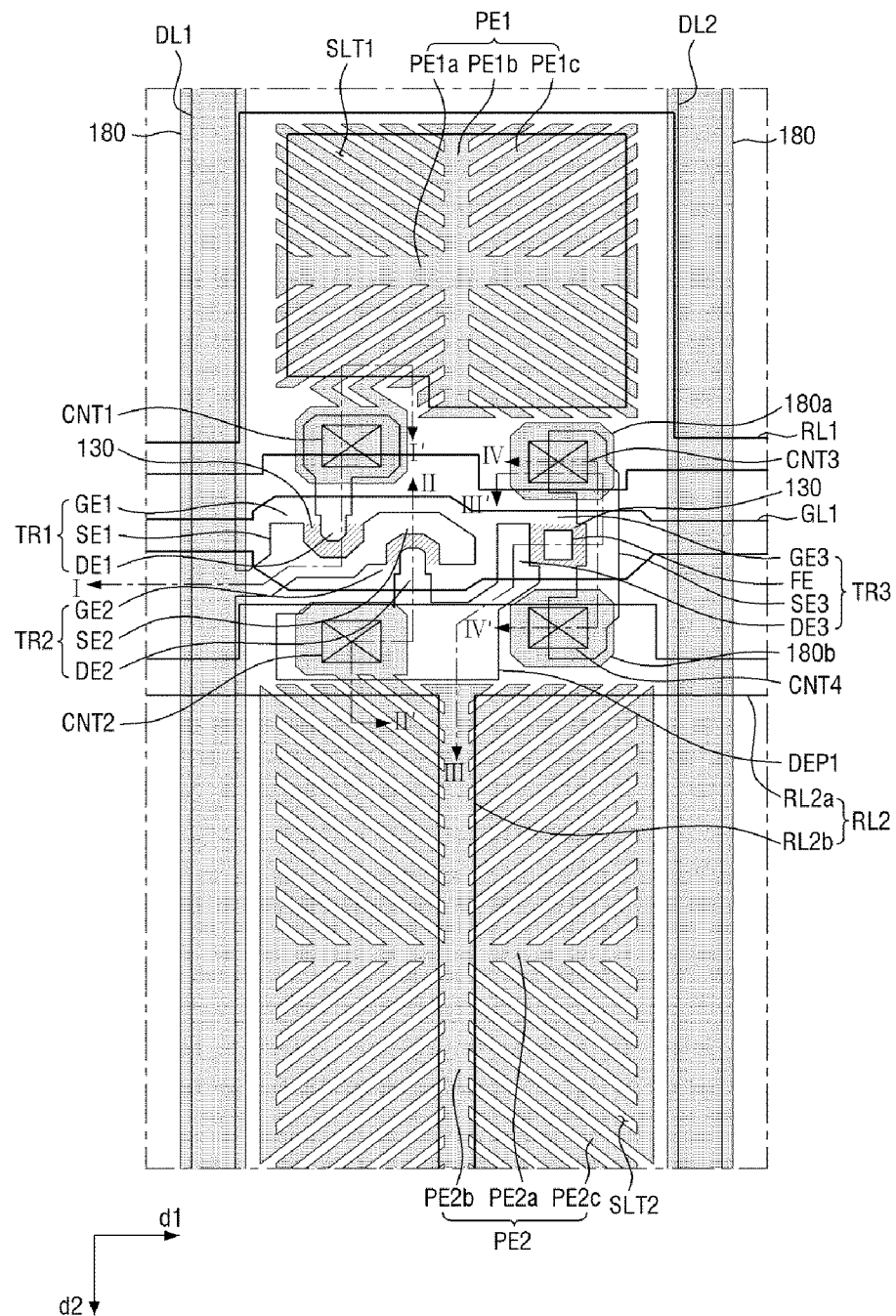
FIG. 2 is a plan view specifically illustrating the first pixel unit shown in FIG. 1.
Figure 3:
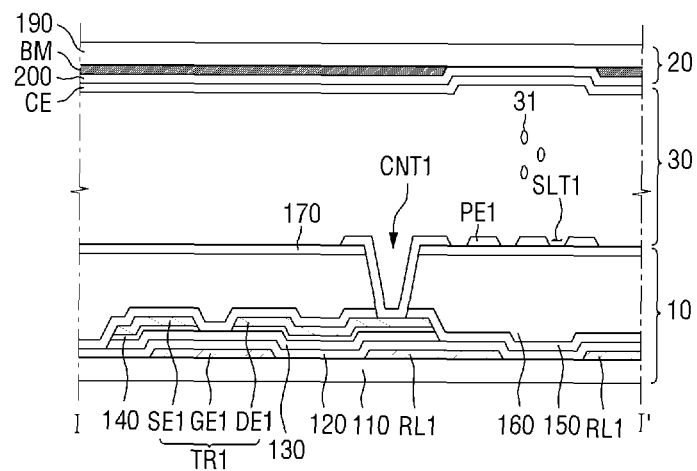
FIG. 3 is a cross-sectional view taken along line I-I' of FIG. 2.
Figure 4:
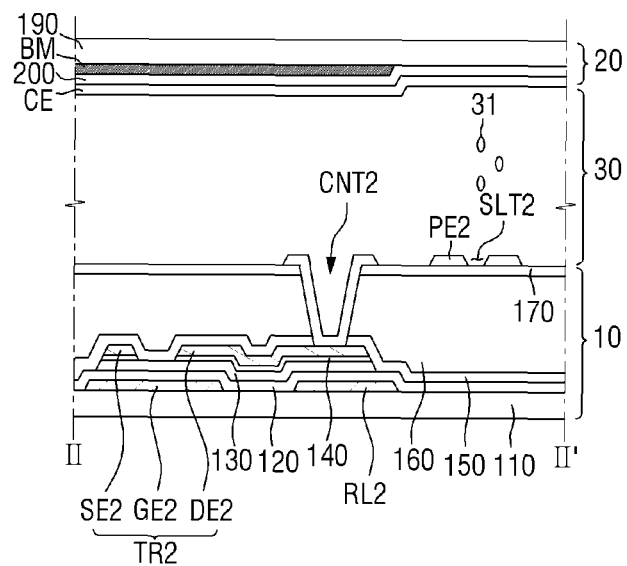
FIG. 4 is a cross-sectional view taken along line II-II' of FIG. 2.
Figure 5:
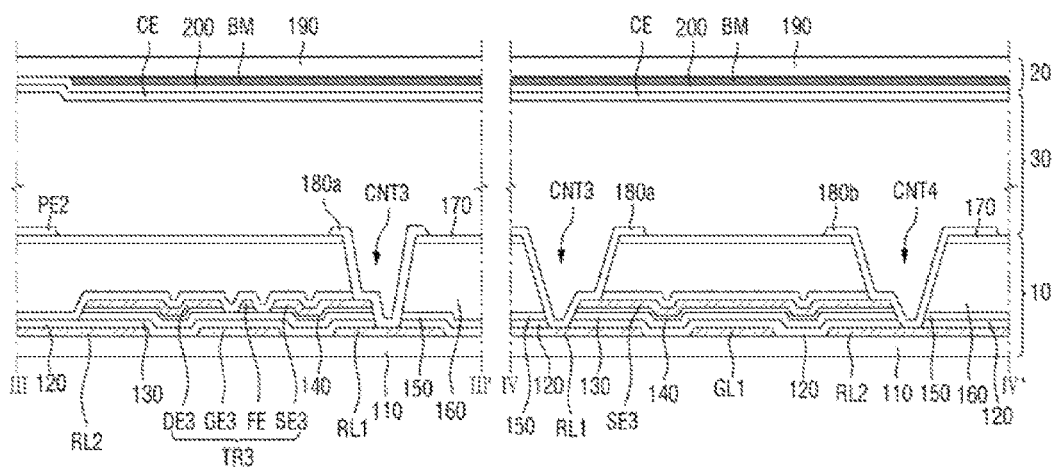
FIG. 5 is a cross-sectional view taken along the lines III-III' and IV-IV' of FIG. 2.
Figure 6:
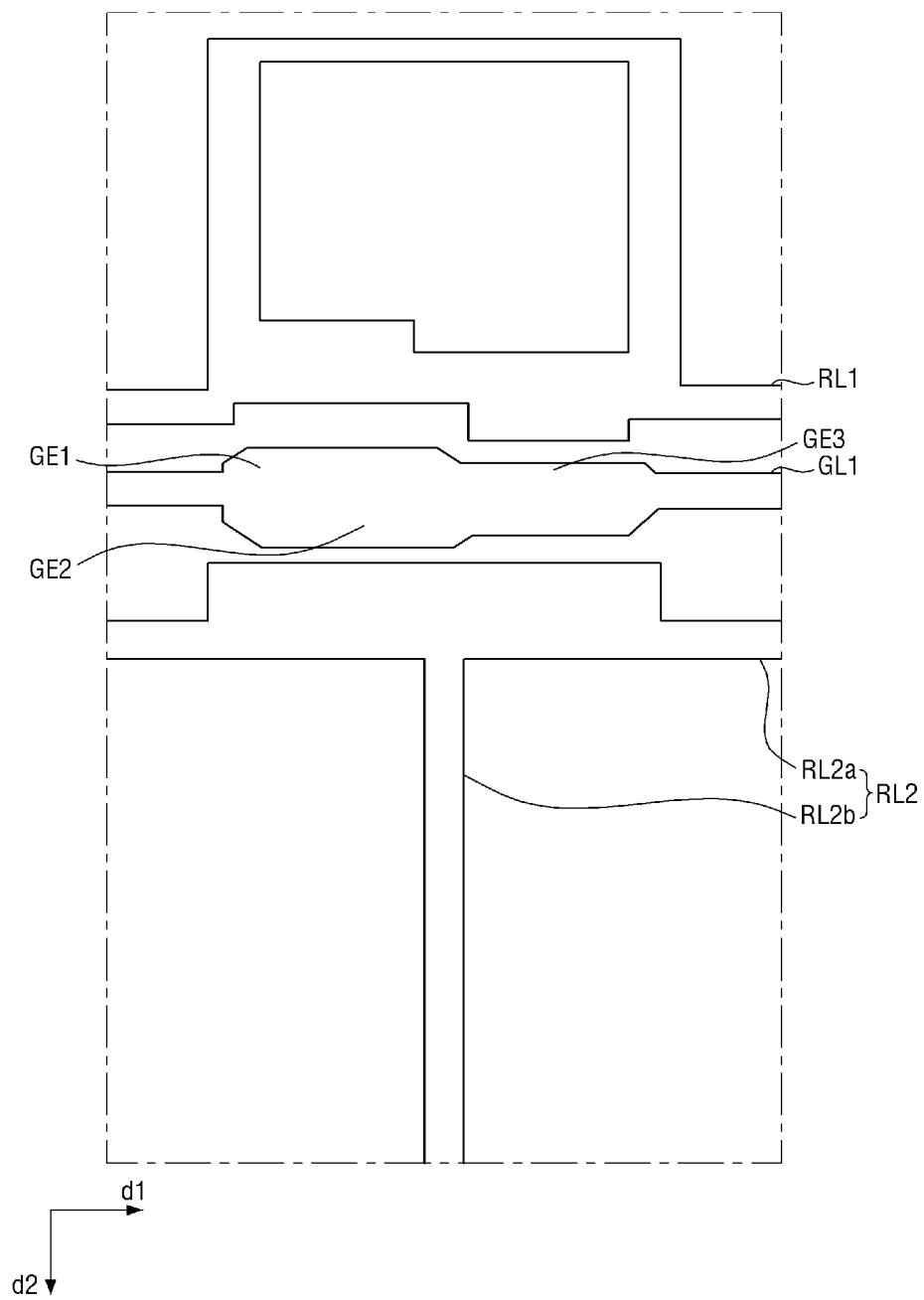
FIG. 6 is a schematic view illustrating a first gate line, a first storage line and a second storage line of the LCD device shown in FIG. 2.
Figure 7:
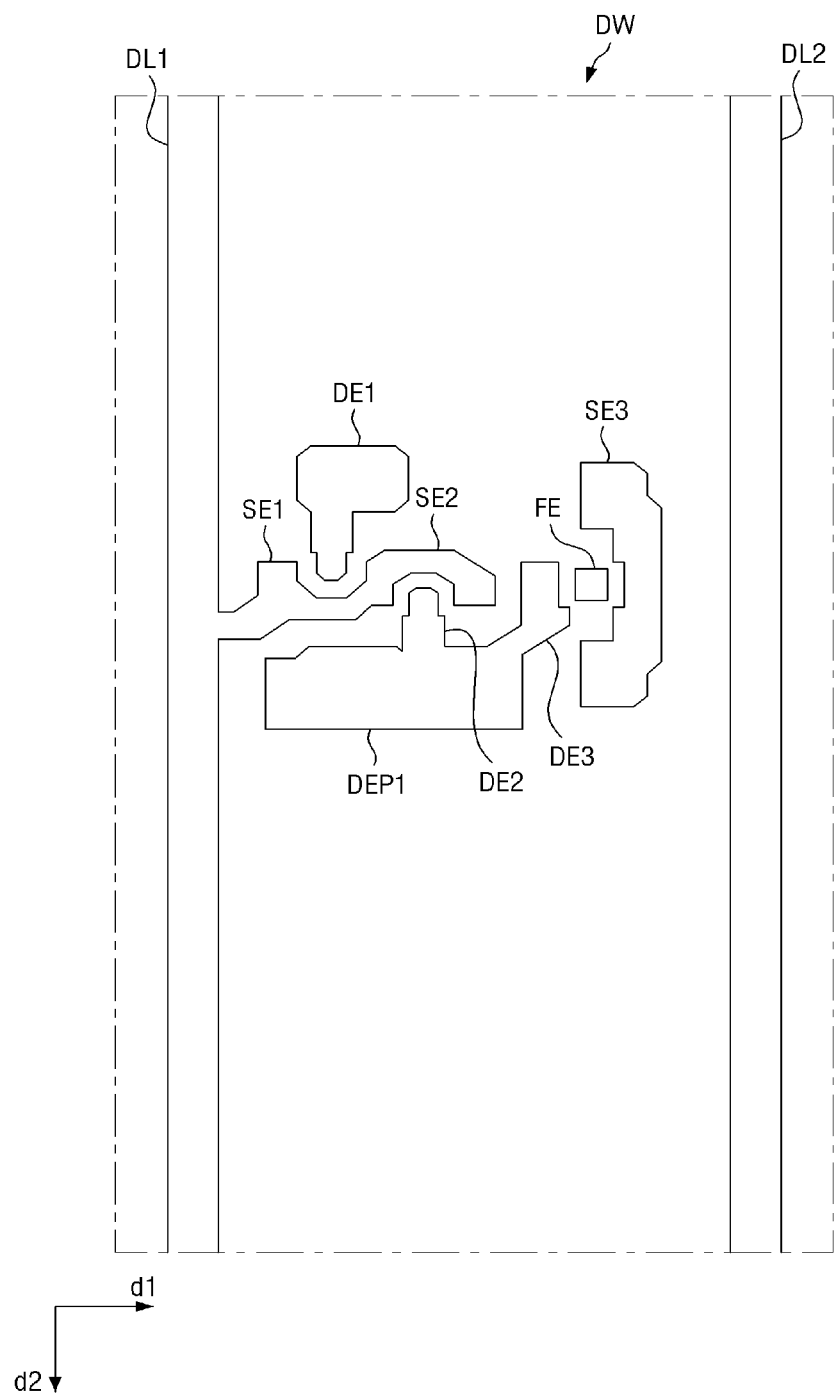
FIG. 7 is a schematic view illustrating a data conductor of the LCD device shown in FIG. 2.

FIG. 1 is an equivalent circuit diagram illustrating a first pixel unit of the configuration of an LCD device according to an exemplary embodiment of the invention. FIG. 2 is a plan view specifically illustrating the first pixel unit shown in FIG. 1. FIG. 3 is a cross-sectional view taken along line I-I' of FIG. 2. FIG. 4 is a cross-sectional view taken along line II-II' of FIG. 2. FIG. 5 is a cross-sectional view taken along the lines III-III' and IV-IV' of FIG. 2. FIG. 6 is a schematic view illustrating a first gate line, a first storage line and a second storage line of the LCD device shown in FIG. 2. FIG. 7 is a schematic view illustrating a data conductor of the LCD device shown in FIG. 2.

Referring to FIGS. 2 to 7, the LCD device according to an exemplary embodiment of the invention may include a lower display panel 10, an upper display panel 20, and a liquid crystal layer 30 provided therebetween. The lower display panel 10 is disposed to face the upper display panel 20. In an exemplary embodiment, the lower display panel 10 may be attached to the upper display panel 20 through sealing.

For convenience of explanation, the first electrode and the second electrode of the first switching element TR1 are represented by a first source electrode SE1 and a first drain electrode DE1, respectively. The first electrode and the second electrode of the second switching element TR2 are represented by a second source electrode SE2 and a second drain electrode DE2, respectively. The first electrode and the second electrode of the third switching element TR3 are represented by a third source electrode SE3 and a third drain electrode DE3, respectively.

First, the lower display panel 10 will be described.

A first gate line GL1, first to third gate electrodes GE1 to GE3, a first storage line RL1, and a second storage line RL2 are disposed on a lower substrate 110. In an exemplary embodiment, the lower substrate 110 may be a transparent glass substrate, a transparent plastic substrate, or the like.

The first gate line GL1 may be disposed to be extended in the first direction d1. The first to third gate electrodes GE1 to GE3 may be connected with the first gate line GL1.

In an exemplary embodiment, each of the first gate line GL1 and the first to third gate electrodes GE1 to GE3 may include a single-layer film, a double-layer film or a triple-layer film, which includes one, two or three of conductive metals including at least one of aluminum (Al), copper (Cu), molybdenum (Mo), chromium (Cr), titanium (Ti), tungsten (W), molybdenum-tungsten (MoW), molybdenum-titanium (MoTi), and copper/molybdenum-titanium (Cu/MoTi).

Referring to FIG. 6, the first and second storage lines RL1 and RL2 may be disposed on the lower substrate 110 (refer to FIGS. 3 to 5). That is, the first and second storage lines RL1 and RL2 may be disposed on the same layer as that on which the first gate line GL1 and the first to third gate electrodes GE1 to GE3 are disposed, and may be insulated from the first gate line GL1 and the first to third gate electrodes GE1 to GE3. In an exemplary embodiment, the first to third gate electrodes GE1 to GE3 may include the same material as that of the first gate line GL1 and the first to third gate electrodes GE1 to GE3. Further, in an exemplary embodiment, the first to third gate electrodes GE1 to GE3 may be simultaneously provided together with the first gate line GL1 and the first to third gate electrodes GE1 to GE3 through the same mask process.

Based on FIG. 2, the first storage line RL1 may be disposed above the first gate line GL1. That is, at least a part of the first storage line RL1 may be disposed to overlap the first subpixel electrode PE1 to be described later. In an exemplary embodiment, the first storage line RL1 may have a square ring shape surrounding the first subpixel electrode PE1, for example. However, the shape and size of the first storage line RL1 are not limited to those shown in FIG. 2.

Based on FIG. 2, the second storage line RL2 may be disposed below the first gate line GL1. The second storage line RL2 may include a horizontal portion RL2a extending in the first direction d1 and a vertical portion RL2b extending in the second direction d2. The horizontal portion RL2a of the second storage line RL2 may be connected with a storage line located in a region of another pixel unit adjacent to the first pixel unit PX1. At least a part of the vertical portion RL2b of the second storage line RL2 may be disposed to overlap the second subpixel electrode PE2.

In an exemplary embodiment, the vertical portion RL2b of the second storage line RL2 may be disposed to cross the center of the second subpixel electrode PE2. More specifically, the vertical portion RL2b of the second storage line RL2 may extend in the second direction d2 so as to overlap the second stem portion PE2b of the second subpixel electrode PE2 to be described later. However, the shape and size of the second storage line RL2 are not limited to those shown in FIG. 2.

A gate insulating film 120 may be disposed on the first gate line GL1, the first to third gate electrodes GE1 to GE3, the first storage line RL1, and the second storage line RL2. In an exemplary embodiment, the gate insulating film 120 may include at least one of silicon nitride (SiNx) or silicon oxide (SiOx), for example. The gate insulating film 120 may have a multiple film structure including at least two insulating layers different from each other in physical properties.

A semiconductor layer 130 may be disposed on the gate insulating film 120. The semiconductor layer 130 may include the channel regions of first to third switching elements TR1 to TR3. In an exemplary embodiment, the semiconductor layer 130 may include an oxide semiconductor, for example. That is, the semiconductor layer 130 may include one oxide semiconductor selected from IGZO (In—Ga-Zinc-Oxide), ZnO, $ZnO_2$, CdO, SrO, $SrO_2$, CaO, $CaO_2$, MgO, $MgO_2$, InO, $In_2O_2$, GaO, $Ga_2O$, $Ga_2O_3$, SnO, $SnO_2$, GeO, $GeO_2$, PbO, $Pb_2O_3$, $Pb_3O_4$, TiO, $TiO_2$, $Ti_2O_3$, and $Ti_3O_5$. In another exemplary embodiment, the semiconductor layer 130 may include amorphous silicon or polycrystalline silicon, for example.

A resistive contact layer 140 may be disposed on the semiconductor layer 130. In an exemplary embodiment, the resistive contact layer 140 may include $n^+$ hydrogenated amorphous silicon doped with n-type impurity, such as phosphorus, at high concentration, or may include silicide. In another exemplary embodiment, the resistive contact layer 140 may be omitted when the semiconductor layer 130 includes an oxide semiconductor. In the specification, an example in which the resistive contact layer 140 is disposed on the semiconductor layer 130 will be described.

Referring to FIG. 7, a data conductor DW may be disposed on the gate insulating film 120 (refer to FIGS. 3 to 5) and the resistive contact layer 140 (refer to FIGS. 3 to 5). In an exemplary embodiment, the data conductor DW may include a single-layer film, a double-layer film or a triple-layer film, which includes one, two, or three of conductive metals including at least one of aluminum (Al), copper (Cu), molybdenum (Mo), chromium (Cr), titanium (Ti), tungsten (W), molybdenum-tungsten (MoW), molybdenum-titanium (MoTi), and copper/molybdenum-titanium (Cu/MoTi). However, the invention is not limited thereto, and the data conductor DW may include various metals or conductors.

In an exemplary embodiment, the data conductor DW may be simultaneously provided together with the semiconductor 130 and the resistive contact layer 140 through the same mask process. In this case, the data conductor DW may have substantially the same shape as that of the semiconductor layer 130 except for the channel regions of the first to third switching elements TR1 to TR3 in the semiconductor layer 130. The channel regions of the first to third switching elements TR1 to TR3 will be described later.

The data conductor DW may include a first data line DL1, a second data line DL2, a first source electrode SE1, a first drain electrode DE1, a second source electrode SE2, a second drain electrode DE2, a third source electrode SE3, and a third drain electrode DE3.

The first source electrode SE1, the first drain electrode DE1, and the first gate electrode GE1 provide the first switching element TR1. The first source electrode SE1 of the first switching element TR1 may be connected with the first data line DL1. The first drain electrode DE1 of the first switching element TR1 may be connected with the first subpixel electrode PE1 through a first contact hole CNT1. The first source electrode SE1 of the first switching element TR1 may be disposed to be spaced apart from the first drain electrode DE1 of the first switching element TR1 by a predetermined distance on the same layer. The channel region of the first switching element TR1 may be defined between the first source electrode SE1 and the first drain electrode DE1 according to the first gate signal G1 provided through the first gate electrode GE1.

The second source electrode SE2, the second drain electrode DE2, and the second gate electrode GE2 provide the second switching element TR2. The second source electrode SE2 of the second switching element TR2 may be connected with the first data line DL1. The second drain electrode DE2 of the second switching element TR2 may be connected with the second subpixel electrode PE2 through a second contact hole CNT2. The second source electrode SE2 of the second switching element TR2 may be disposed to be spaced apart from the second drain electrode DE2 of the second switching element TR2 by a predetermined distance on the same layer. The channel region of the second switching element TR2 may be defined between the second source electrode SE2 and the second drain electrode DE2 according to the first gate signal G1 provided through the second gate electrode GE2.

The second switching element TR2 may further include a drain electrode extension DEP1 extending from the second drain electrode DE2 and overlapping the horizontal portion RL2a of the second storage line RL2. The drain electrode extension DEP1 overlaps the horizontal portion RL2a of the second storage line RL2, thereby increasing the capacitance component of the second storage capacitor Cst2. Further, a kickback voltage may be reduced by the parasitic component between the second gate electrode GE2 and the second drain electrode DE2 in the second switching element TR2.

The third source electrode SE3, the third drain electrode DE3, and the third gate electrode GE3 provide the third switching element TR3. The third source electrode SE3 of the third switching element TR3 may be connected with both the first storage line RL1 and the second storage line RL2. That is, the third source electrode SE3 of the third switching element TR3 may have the same configuration as that of the above-described third storage line RL3. Therefore, the third storage line RL3 is disposed on the different layer from that on which the first and second storage lines RL1 and RL2 are disposed. Hereinafter, the third storage line RL3, and the third source electrode SE3 of the third switching element TR3 will be used interchangeably with each other, in some cases.

More specifically, the third source electrode SE3 of the third switching element TR3 may be connected with the first storage line RL1 through a third contact hole CNT3. Further, the third source electrode SE3 of the third switching element TR3 may be connected with the second storage line RL2 through a fourth contact hole CNT4. Therefore, the third source electrode SE3 of the third switching element TR3 may overlap all of the first storage line RL1, the second storage line RL2, and the first gate line GL1.

The third drain electrode DE3 of the third switching element TR3 may be connected with the second subpixel electrode PE2. That is, the third switching element TR3 provides the storage signals S received from the first and second storage lines RL1 and RL2 to the second subpixel electrode PE2, thereby dividing the voltage charged in the second liquid crystal capacitor Clc2.

Accordingly, the third source electrode SE3 of the third switching element SE3 may be connected with both the first storage line RL1 and the second storage line RL2 through the third contact hole CNT3 and the fourth contact hole CNT4, respectively. Therefore, all the first storage line RL1 and the horizontal portion RL2a of the second storage line RL2, which are entirely arranged in the first direction d1, and the third source electrode SE3 of the third switching element TR3 and the vertical portion RL2b of the second storage line RL2, which are entirely arranged in the second direction d2, are connected in a mesh structure in the region of the first subpixel unit PX1. Through this, resistance components of the first to third storage lines RL1 to RL3 providing storage signals may be reduced, and, as a result, a current-resistance ("IR") drop phenomenon of the storage signal S provided to the third source electrode SE3 of the third switching element TR3 may be prevented.

The first and second storage lines RL1 and RL2 are insulated from a blocking electrode 180 to be described later. Accordingly, the first and second storage lines RL1 and RL2 may perform a voltage driving independently with the blocking electrode 180. Further, all of the first storage line RL1, the second storage line RL2, and the third source electrode SE3 of the third switching element TR3 include metal, thereby reducing resistance components. Moreover, all of the first storage line RL1, the second storage line RL2, and the third source electrode SE3 of the third switching element TR3 are connected to form a mesh structure, thereby reducing the ripple components of storage signals S.

The third switching element TR3 may further include a floating electrode FE disposed between the third source electrode SE3 and the third drain electrode DE3. That is, in an exemplary embodiment, the third switching element TR3 may be a field relaxation transistor, for example.

A first passivation film 150 may be disposed on the data conductor DW and the gate insulating film 120. In an exemplary embodiment, the first passivation film 150 may include an inorganic insulating material, such as silicon nitride or silicon oxide. The first passivation film 150 may prevent the pigment of an organic insulating film 160 to be described later from flowing into the exposed portion of the semiconductor layer 130.

The organic insulating film 160 may be disposed on the first passivation film 150. The organic insulating film 160 has excellent planarization characteristics, and may include an organic material having photosensitivity. In another exemplary embodiment, the organic insulating film 160 may also be omitted.

Although not shown in the drawings, a color filter may be disposed on the first passivation film 150. That is, the color filter may be disposed between the first passivation film 150 and the organic insulating film 160. In an exemplary embodiment, the color filter may display one of three primary colors, such as red, green, and blue, but the invention is not limited thereto. The color filter may include materials displaying different colors for each adjacent pixel. The color filter may also be disposed over an upper display panel 20 to be described later.

A second passivation film 170 may be disposed on the organic insulating film 160. In an exemplary embodiment, the second passivation film 170 may include an inorganic insulating material, such as silicon nitride or silicon oxide. The second passivation film 170 may prevent the upper portion of the organic insulating film 160 from being lifted up, and may prevent the contamination of the liquid crystal layer 30 due to an organic material, such as a solvent, inflowing from the organic insulating film 160 so as to prevent the failure of an afterimage that may be caused at the time of driving a screen.

The first and second subpixel electrodes PE1 and PE2 may be disposed on the second passivation film 170. The first subpixel electrode PE1 may be connected with the first drain electrode DE1 of the first switching electrode TR1, the first drain electrode DE1 being exposed through the first contact hole CNT1. The second subpixel electrode PE2 may be connected with the second drain electrode DE2 of the second switching electrode TR2, the second drain electrode DE2 being exposed through the second contact hole CNT2.

In an exemplary embodiment, the first and second subpixel electrodes PE1 and PE2 may include a transparent conductive material, such as indium tin oxide ("ITO") or indium zinc oxide ("IZO"), or may include a reflective metal, such as aluminum, silver, chromium, or an alloy thereof.

The first subpixel electrode PE1 may include a first stem portion PE1a extending in the first direction d1, a second stem portion PE1b extending in the second direction d2, and a plurality of branch portions PE1c respectively extending from the first stem portion PE1a and the second stem portion PE1b. Further, a plurality of first slits SLT1 may be defined in the first subpixel electrode PE1 between the plurality of branch portions PE1c. The second subpixel electrode PE2 may include a first stem portion PE2a extending in the first direction d1, a second stem portion PE2b extending in the second direction d2, and a plurality of branch portions PE2c respectively extending from the first stem portion PE2a and the second stem portion PE2b. Further, a plurality of second slits SLT2 may be defined in the second subpixel electrode PE2 between the plurality of branch portions PE2c.

In an exemplary embodiment, a case of the first subpixel electrode PE1 will be described, for example. The plurality of first slits SLT1 of the first subpixel electrode PE1 generates a fringe field between the first subpixel electrode PE1 and the common electrode CE to be described later, so as to allow a plurality of liquid crystal molecules 31 to rotate in a predetermined direction. The blocking electrode 180 may be disposed on the second passivation film 170. The blocking electrode 180 and the first and second subpixel electrodes PE1 and PE2 may be disposed on the same layer. The blocking electrode 180 may be disposed to overlap a plurality of data lines including the first and second data lines DL1 and DL2. Therefore, the blocking electrode 180 may prevent a light leakage phenomenon caused by the coupling of the plurality data lines with the plurality of subpixel electrodes adjacent to each of the data lines.

In an exemplary embodiment, the blocking electrode 180 may include a transparent conductive material, such as ITO or IZO, or may include a reflective metal, such as aluminum, silver, chromium, or an alloy thereof. In an exemplary embodiment, the blocking electrode 180 may be connected with the common electrode CE outside the first pixel unit PX1 so as to receive a common voltage.

A first floating electrode 180a and a second floating electrode 180b may be disposed on the second passivation film 170 to be disposed on the same layer as that on which the blocking electrode 180 is disposed. The first floating electrode 180a may be provided to cover the third contact hole CNT3. The second floating electrode 180b may be provided to cover the fourth contact hole CNT 4.

More specifically, the first floating electrode 180a may connect the first storage line RL1 with the third source electrode SE3 of the third switching element TR3. Further, the second floating electrode 180b may connect the second storage line RL2 with the third source electrode SE3 of the third switching element TR3. That is, the first floating electrode 180a serves as a bridge electrode between the first storage line RL1 and the third source electrode SE3 of the third switching element TR3. Further, the second floating electrode 180b serves as a bridge electrode between the second storage line RL2 and the third source electrode SE3 of the third switching element TR3.

The first and second floating electrodes 180a and 180b may be insulated from the blocking electrode 180 and the first and second subpixel electrodes PE1 and PE2 disposed on the same layer, respectively.

The first floating electrode 180a may connect the first storage line RL1 with the third source electrode SE3 of the third switching element TR3 through the third contact hole CNT3. The second floating electrode 180b may connect the second storage line RL2 with the third source electrode SE3 of the third switching element TR3 through the fourth contact hole CNT4. In an exemplary embodiment, the first floating electrode 180a and the second floating electrode 180b may include a transparent conductive material, such as ITO or IZO, or may include a reflective metal, such as aluminum, silver, chromium, or an alloy thereof.

Although not shown in the drawings, a first alignment film may be disposed on the first subpixel electrode PE1, the second subpixel electrode PE2, the blocking electrode 180, and the first and second floating electrodes 180a and 180b. In an exemplary embodiment, the first alignment film may include polyimide.

Next, the upper display panel 20 will be described.

The upper display panel 20 may be disposed to face the lower display panel 10. The upper display panel 20 may include transparent glass or transparent plastic. In an exemplary embodiment, the upper display panel 20 may include the same material as that of the lower display panel 10.

A black matrix BM for blocking the transmission of light to a region other than the pixel region may be disposed on an upper substrate 190. In an exemplary embodiment, the black matrix BM may include a metallic material including organic matter or chromium.

An overcoat layer 200 may be disposed on the upper substrate 190 and the black matrix BM. The overcoat layer 200 may include an insulating material. The overcoat layer 200 may be omitted in some cases.

A common electrode CE may be disposed on the overcoat layer 200. At least a part of the common electrode CE may be disposed to overlap the first and second subpixel electrodes PE1 and PE2. The common electrode CE may generate an electric field together with each of the first and second subpixel electrodes PE1 and PE2. The plurality of liquid crystal molecules 31 may be aligned according to the generated electric field.

However, as described above, since the level of the voltage charged in the second liquid crystal capacitor Clc2 is lower than the level of the voltage charged in the first liquid crystal capacitor Clc1, the aligned state of the plurality of liquid crystal molecules located between the second subpixel electrode PE2 and the common electrode CE is different from the aligned state of the plurality of liquid crystal molecules located between the first subpixel electrode PE1 and the common electrode CE.

Although not shown in the drawings, a second alignment film (not shown) may be disposed on the common electrode CE. The second alignment film may include polyimide.

Figure 8:
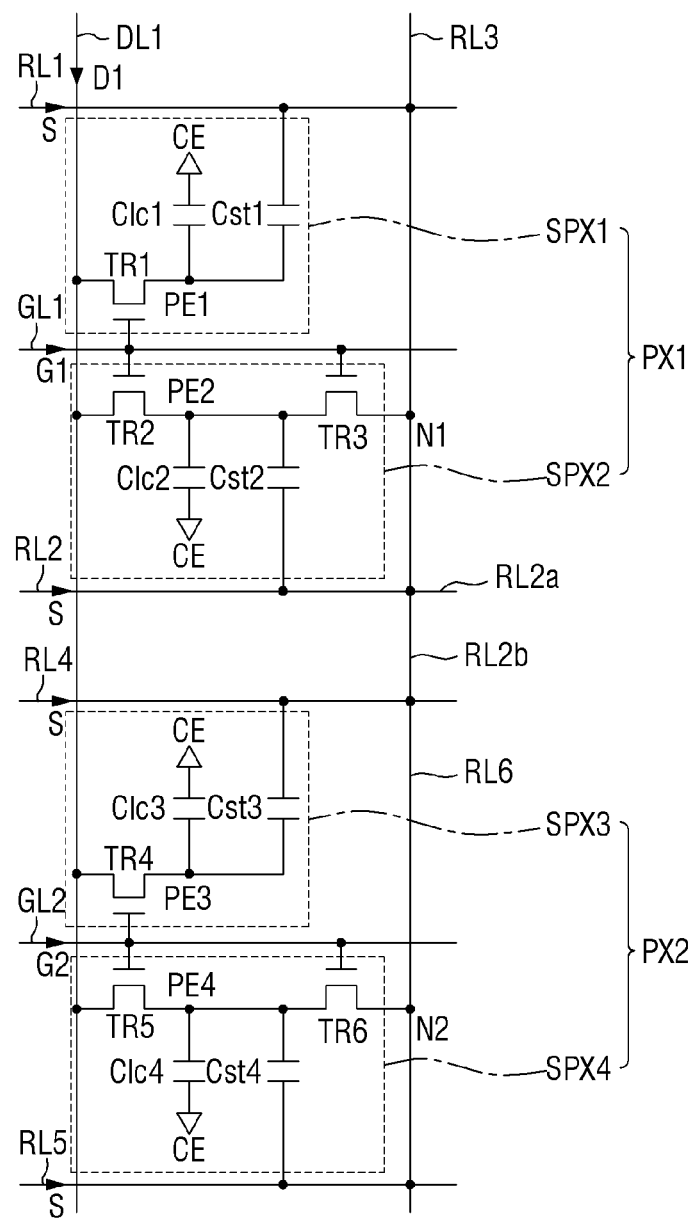
FIG. 8 is an equivalent circuit diagram illustrating the first pixel unit shown in FIG. 1 and a second pixel unit connected therewith.

FIG. 8 is an equivalent circuit diagram illustrating the first pixel unit shown in FIG. 1 and a second pixel unit connected therewith. However, the duplicate contents having been described in the first pixel unit PX1 will not be repeated.

Referring to FIG. 8, the LCD device according to an exemplary embodiment of the invention may further include a second pixel unit PX2 adjacent to the first pixel unit PX1. The second pixel unit PX2 may include a third subpixel unit SPX3 and a fourth subpixel unit SPX4.

The third subpixel unit SPX3 may include a fourth switching element TR4 connected to a second gate line GL2 and the first data line DL1, and a third subpixel electrode PE3 connected with the fourth switching element TR4. At least a part of the third subpixel electrode PE3 may overlap a fourth storage line RL4.

The fourth subpixel unit SPX4 may include a fifth switching element TR5 connected to the second gate line GL2 and the first data line DL1, and a fourth subpixel electrode PE4 connected with the fifth switching element TR5. The fourth subpixel unit SPX4 may further include a sixth switching element TR6 connected with the second gate line, the fourth subpixel electrode PE4, and a sixth storage line RL6. The fifth switching element TR5 may be connected to the fourth storage line RL4 via a second node N2

At least a part of the fourth subpixel electrode PE4 may overlap a fifth storage line RL5. Further, the sixth storage line RL6 may be connected with both the fourth storage line RL4 and the fifth storage line RL5. Moreover, the fourth storage line RL4 may be connected with the vertical portion RL2b of the second storage line RL2.

That is, the second pixel unit PX2 may be disposed adjacent to the first pixel unit PX1. In the specification, the expression "two configurations being disposed adjacent to each other" means that the same configuration as the two configurations is not disposed between these two configurations. Hereinafter, this configuration will be described in more detail with reference to FIG. 9.

Figure 9:
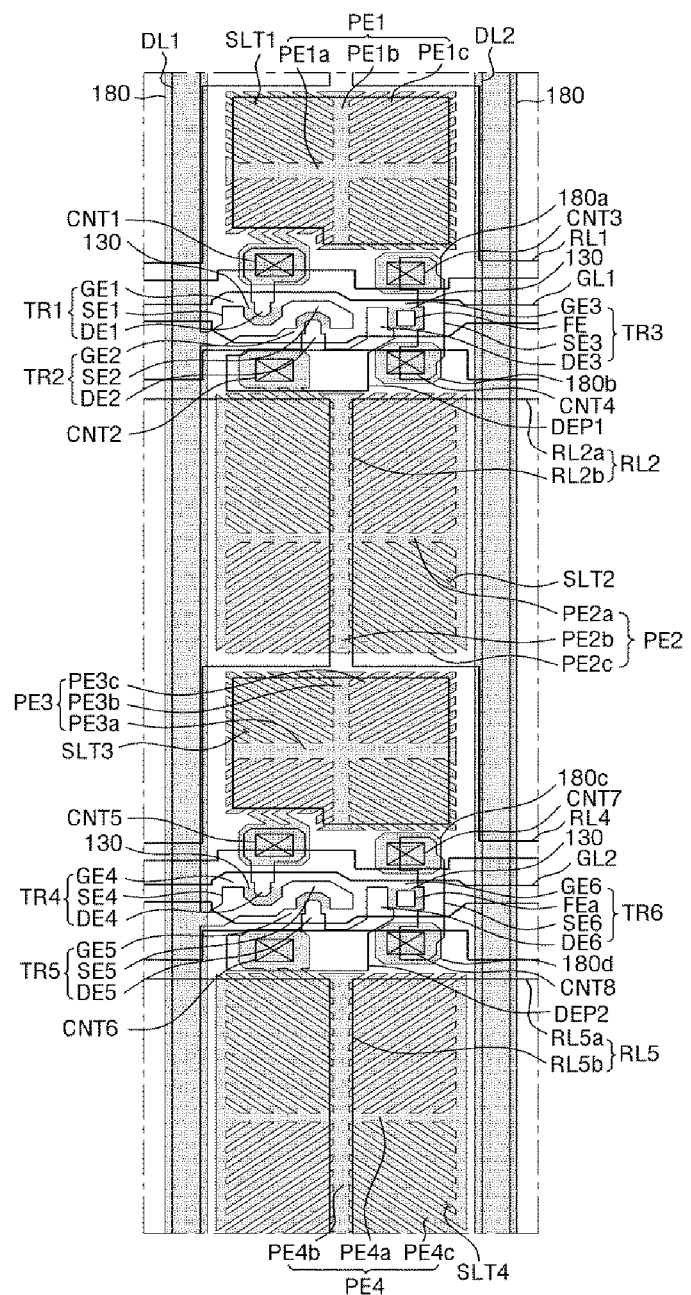
FIG. 9 is a plan view specifically illustrating the first and second pixel units shown in FIG. 8.

FIG. 9 is a plan view specifically illustrating the first and second pixel units shown in FIG. 8. However, the duplicate contents having been described in the first pixel unit PX1 will not be repeated. Hereinafter, the fourth storage line RL4, the fifth storage line RL5, the sixth storage line RL6, and the sixth switching element TR6 will be described in detail.

The fourth storage line RL4 may have a square ring shape surrounding the third subpixel electrode PE3. The third subpixel electrode PE3 may include a first stem portion PE3a extending in the first direction d1, a second stem portion PE3b extending in the second direction d2, and a plurality of branch portions PE3c respectively extending from the first stem portion PE3a and the second stem portion PE3b. The third subpixel electrode PE3 may be connected to the fourth switching element TR4 through a fifth contact hole CNT5. The fourth storage line RL4 may be connected with the vertical portion RL2b of the second storage line RL2. The fifth storage line RL5 may include a horizontal portion RL5a extending in the first direction d1 and a vertical portion RL5b extending in the second direction d2. The vertical portion RL5b of the fifth storage line RL5 may be disposed to overlap the fourth subpixel electrode PE4, and, in an exemplary embodiment, may be disposed to cross the center of the fourth subpixel electrode PE4. The fourth and fifth storage lines RL4 and RL5 may be disposed on the same layer the first storage line RL1, the second storage line RL2, and the first gate line GL1.

The sixth storage line RL6 may have the same configuration as the sixth source electrode SE6 of the sixth switching element TR6. Since the sixth source electrode SE6 of the sixth switching element TR6 is disposed on the same layer as the first data line DL1, the sixth storage line RL6 is disposed on the different layer from that on which the fourth and fifth storage lines RL4 and RL5 are disposed. Hereinafter, the sixth storage line RL6, and the sixth source electrode SE6 of the sixth switching element TR6 will be used interchangeably with each other, in some cases.

The sixth source electrode SE6 of the sixth switching element TR6 may be connected with the fifth storage line RL4 through a seventh contact hole CNT7. Further, the sixth source electrode SE6 of the sixth switching element TR6 may be connected with the fifth storage line RL5 through an eighth contact hole CNT8. Therefore, the sixth source electrode SE6 of the sixth switching element TR6 may overlap all of the fourth storage line RL4, the fifth storage line RL5, and the second gate line GL2.

The sixth drain electrode DE6 of the sixth switching element TR6 may be connected with the fourth subpixel electrode PE4. That is, the sixth switching element TR6 provides the storage signals S received from the fourth and fifth storage lines RL4 and RL5 to the fourth subpixel electrode PE4, thereby dividing the voltage charged in the fourth liquid crystal capacitor Clc4. The sixth switching element TR6 may further include a drain electrode extension DEP2 extending from the sixth drain electrode DE6.

Accordingly, the sixth source electrode SE6 of the sixth switching element TR6 may be connected with both the fourth storage line RL4 and the fifth storage line RL5 through the seventh contact hole CNT7 and the eighth contact hole CNT8, respectively. The third and fourth floating electrodes 180c and 180d may cover the seventh and eighth contact holes CNT7 and CNT8, respectively.

Since the vertical portion RL2b of the second storage line RL2 is connected with the fourth storage line RL4, all of the first to sixth storage lines RL1 to RL6 located in the regions of the first and second pixel units PX1 and PX2 are connected with each other. That is, the first to sixth storage lines RL1 to RL6 are connected with each other while forming a mesh structure, for example. Through this, resistance components of the first to sixth storage lines RL1 to RL6 providing storage signals S may be reduced, and, as a result, an IR drop phenomenon of the storage signal S provided to the third source electrode SE3 of the third switching element TR3 may be prevented.

The fifth switching element TR5 may be connected to the fourth subpixel electrode PE4 through the sixth contact hole CNT6.

The sixth switching element TR6 may further include a floating electrode FEa disposed between the sixth source electrode SE6 and the sixth drain electrode DE6. That is, in an exemplary embodiment, the sixth switching element TR6 may be a field relaxation transistor, for example.

Figure 10:
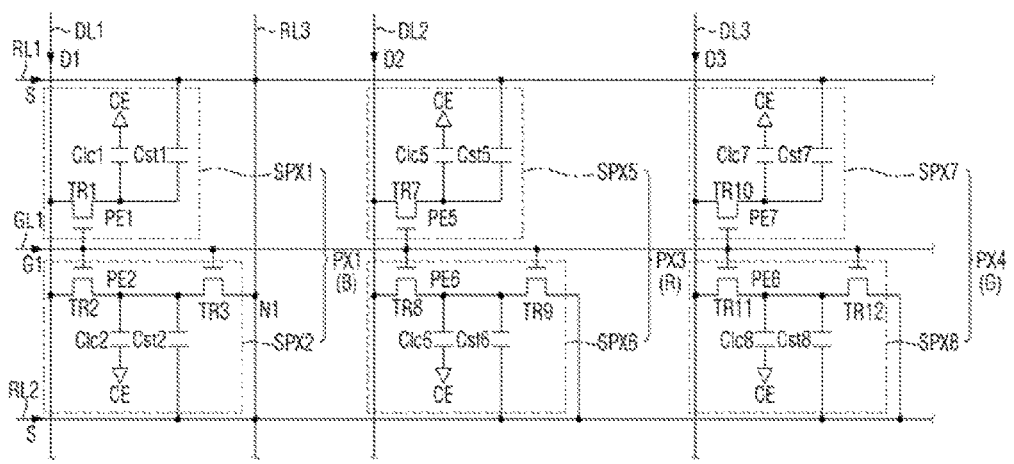
FIG. 10 is an equivalent circuit diagram illustrating another exemplary embodiment of a first pixel unit, a third pixel unit and a fourth pixel unit of the configuration of an LCD device according to the invention.

FIG. 10 is an equivalent circuit diagram illustrating a first pixel unit, a third pixel unit and a fourth pixel unit of the configuration of an LCD device according to another exemplary embodiment of the invention. However, the duplicate contents having been described with reference to FIGS. 1 to 9 will not be repeated. Further, in FIG. 10, a second pixel unit PX2 will not be used in order to avoid the confusion with the second pixel unit PX2 having been described in FIG. 9.

Referring to FIG. 10, an LCD device according to another exemplary embodiment of the invention may include a first pixel unit PX1, a third pixel unit PX3, and a fourth pixel unit PX4. The duplicate contents having been described in the first pixel unit PX1 with reference to FIGS. 1 to 9 will not be repeated.

In an exemplary embodiment, the first pixel unit PX1 may display a blue color, for example. In an exemplary embodiment, the third pixel unit PX3 and the fourth pixel unit PX4 may display one color of a red color and a green color, for example. Hereinafter, for example, it will be described that the third pixel unit PX3 displays a red color and the fourth pixel unit PX4 displays a green color.

The third pixel unit PX3 may include a sixth subpixel unit SPX6 having a ninth switching element TR9. The ninth switching element TR9 may be connected with the first gate line GL1, a sixth subpixel electrode PE6, and the second storage line RL2. The fourth pixel unit PX4 may include an eighth subpixel unit SPX8 having a twelfth switching element TR12. The twelfth switching element TR12 may be connected with the first gate line GL1, an eighth subpixel electrode PE8, and the second storage line RL2. Hereinafter, the ninth switching element TR9 will be described representatively.

The ninth switching element TR9 may be connected with only one of the first storage line RL1 and the second storage line RL2. In the specification, for example, it will be described that the ninth switching element TR9 is connected with the second storage line RL2. That is, the ninth switching element TR9 is not connected with the first storage line RL1.

Therefore, only the third switching element TR3 of the first pixel unit PX1 displaying a blue color is connected with both the first storage line RL1 and the second storage line RL2, and the ninth and twelfth switching elements TR9 and TR12 of the third and fourth pixel units PX3 and PX4 displaying different colors from the color displayed by the first pixel unit PX1 are not connected with the first storage line RL1.

In an exemplary embodiment, a fifth subpixel unit SPX5 includes a seventh switching element TR7, a fifth liquid crystal capacitor Clc5, a fifth storage capacitor Cst5 and a fifth pixel electrode PE5, a subpixel unit SPX6 includes an eighth switching element TR8, a liquid crystal capacitor Clc6 and a storage capacitor Cst6, a subpixel unit SPX7 may include TR10, a seventh pixel electrode PE7, a seventh liquid crystal capacitor Clc7 and a seventh storage capacitor Cst7, and a subpixel unit SPX8 may include an eleventh switching element TR11, an eighth liquid crystal capacitor Clc8 and an eighth storage capacitor Cst8.

Figure 11:
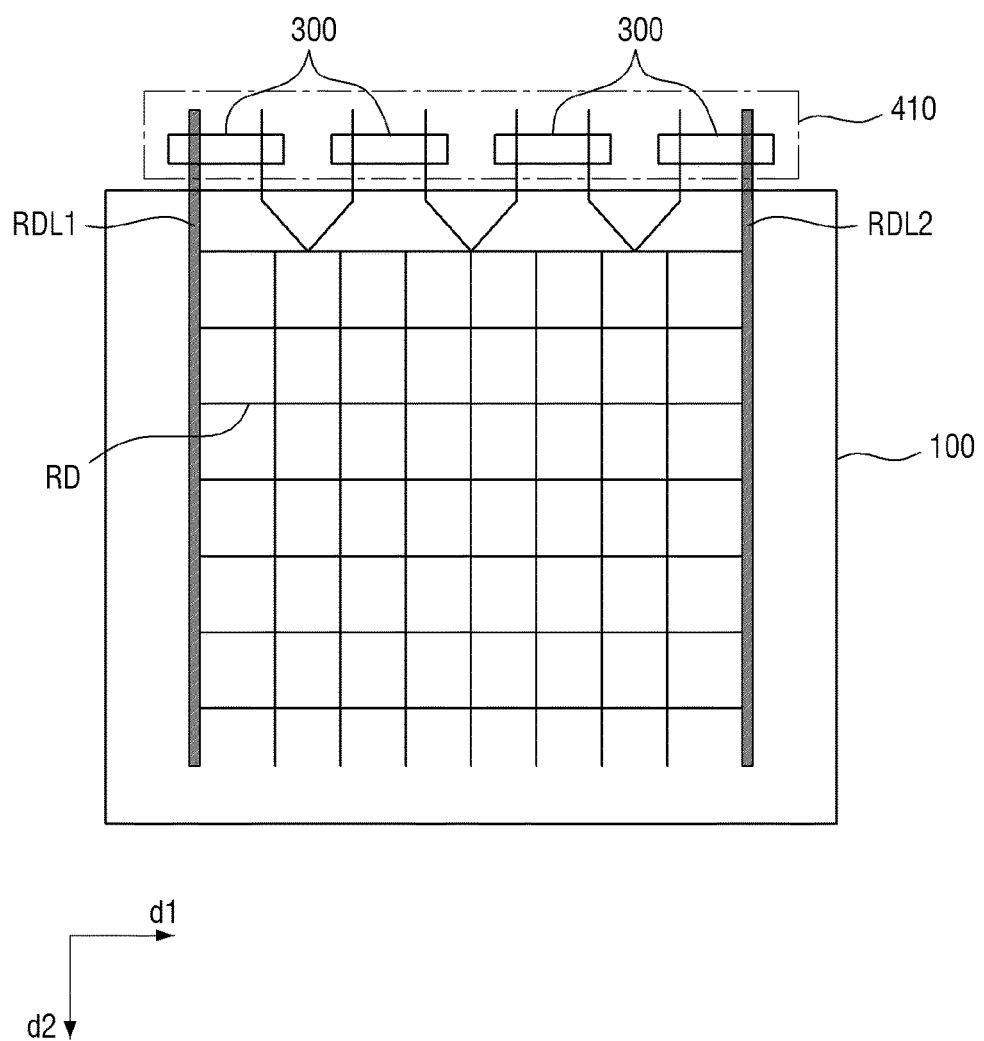
FIG. 11 is a schematic view illustrating an exemplary embodiment of a storage wiring of the configuration of the LCD device according to the invention.

FIG. 11 is a schematic view illustrating a storage wiring of the configuration of the LCD device according to an exemplary embodiment of the invention.

A storage wiring RD, as described above, is provided to have a mesh structure in a display area 100. The storage wiring RD may receive storage signals S through a plurality of data integrated circuits ("ICs") 300 arranged in an external area 410. It is shown in FIG. 11 that the number of the data integrated circuits 300 is four. However, the invention is not limited thereto.

That is, in the LCD device according to an exemplary embodiment of the invention, since the storage wiring RD has a mesh structure, resistance components may be reduced, so as to prevent the voltage drop of the storage signals S.

First and second storage signal application lines RDL1 and RDL2 may extend in the second direction d2 in FIG. 11, and may be disposed at both ends of the first direction d1 to be connected with the storage wiring RD. Here, the thickness of each of the first and second storage signal application lines RDL1 and RDL2 is greater than the thickness of the storage wiring RD.

Figure 12:
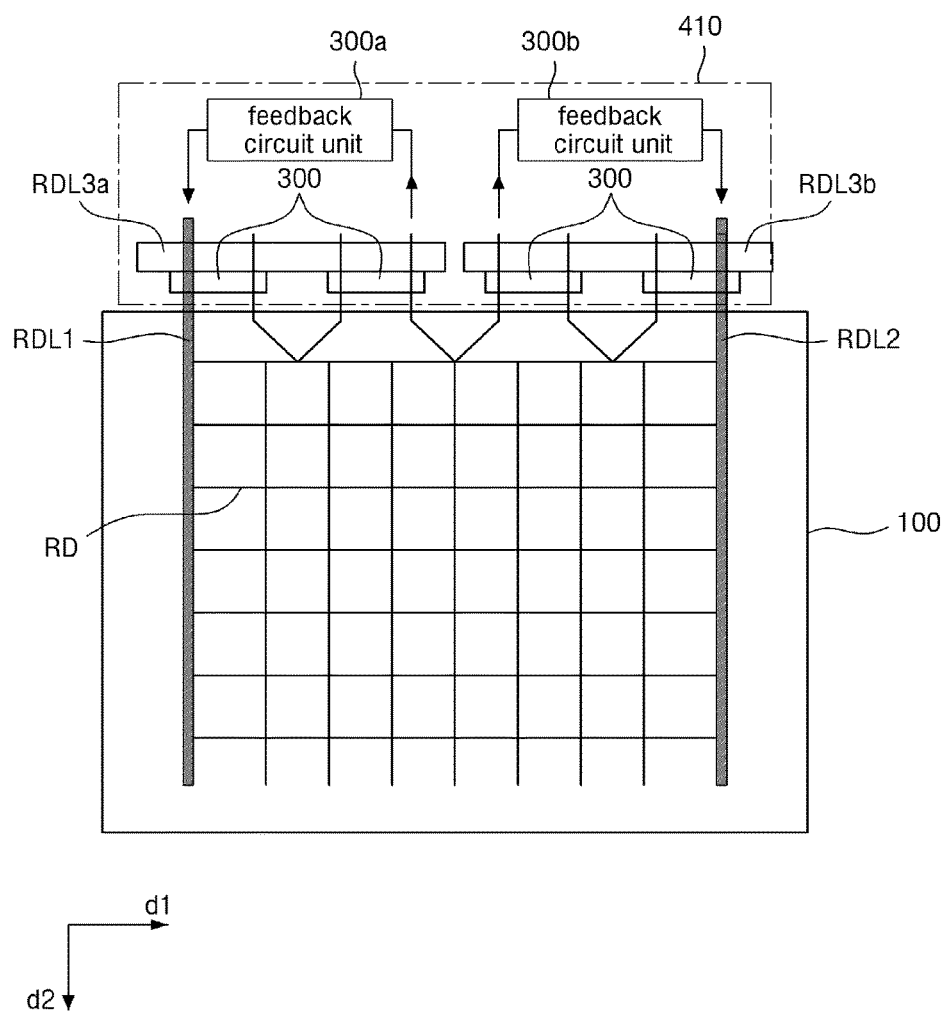
FIG. 12 is a schematic view illustrating an exemplary embodiment of a feedback circuit unit in the configuration of the LCD device according to the invention.

FIG. 12 is a schematic view illustrating a feedback circuit unit in the configuration of the LCD device according to an exemplary embodiment of the invention.

Referring to FIG. 12, the LCD device according to an exemplary embodiment of the invention may further include third storage signal application lines RDL3a and RDL3b.

In an exemplary embodiment, the third storage signal application lines RDL3a and RDL3b extend in the first direction d1 to be connected with wiring lines located at the center of the display area 100 in the storage wiring RD. It is shown in FIG. 12 that two third storage signal application lines RDL3a and RDL3b are provided, but the invention is not limited thereto. That is, one third storage signal application line may be provided, and a plurality of third storage signal application lines may also be provided. Hereinafter, for example, it will be described that two third storage signal application lines RDL3a and RDL3b are provided.

The two third storage signal application lines RDL3a and RDL3b may be connected with two feedback circuit units 300a and 300b, respectively. More specifically, the feedback circuit unit 300a detects a storage signal S from one end of the third storage signal application line RDL3a, the one end thereof being close to the center of the display area 100, in both ends thereof, and compensates for the ripple of the detected storage signal S. Then, the feedback circuit unit 300a provides the compensated storage signal S to the second end of the third storage signal application line RDL3a.

Similarly to this, the feedback circuit unit 300b detects a storage signal S from one end of the third storage signal application line RDL3b, the one end thereof being close to the center of the display area 100, in both ends thereof, and compensates for the ripple of the detected storage signal S. Then, the feedback circuit unit 300b provides the compensated storage signal S to the second end of the third storage signal application line RDL3b.

Accordingly, the storage signal S, from which ripple components are removed, may be provided to the pixel unit connected with the storage wiring RD by compensating for the ripple components of the storage signal S.

The number of the feedback circuit units may be changed depending on the method of forming the third storage signal application lines RDL3a and RDL3b. Moreover, the specific circuit configurations of the feedback circuit units 300a and 300b are not particularly limited as long as ripple components of input signals may be removed.

Figure 13:
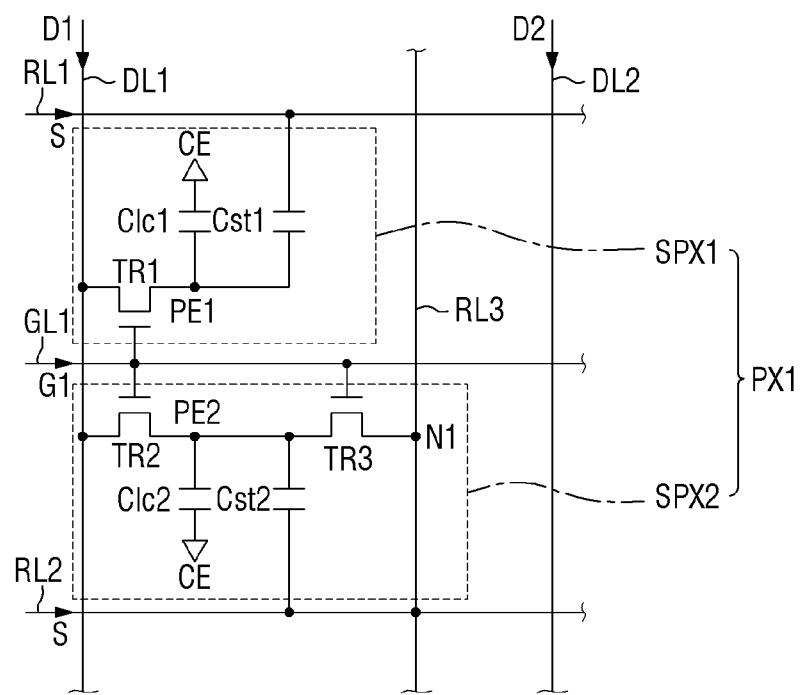
FIG. 13 is an equivalent circuit diagram illustrating another exemplary embodiment of a first pixel unit in the configuration of an LCD device according to the invention.
Figure 14:
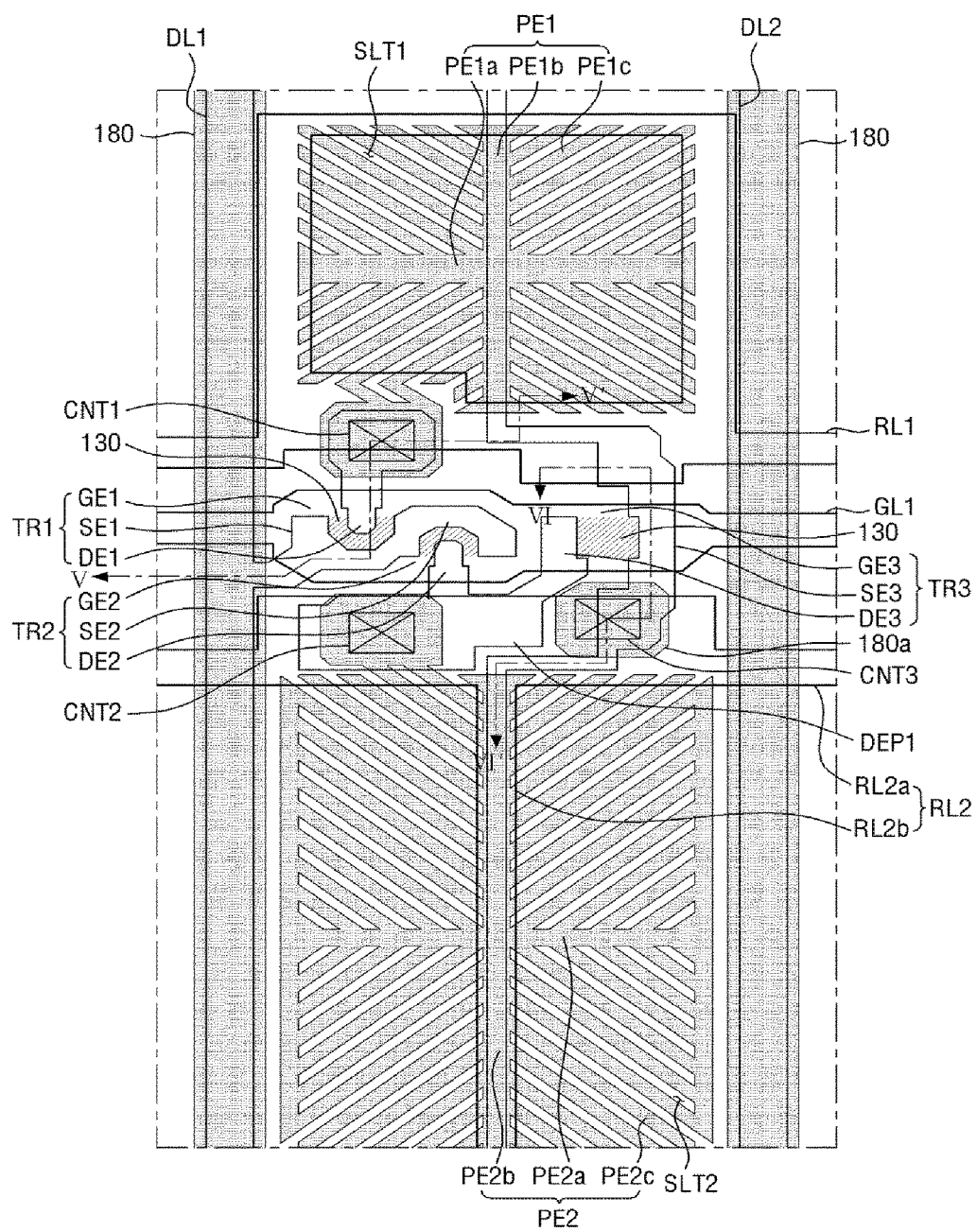
FIG. 14 is a plan view specifically illustrating the first pixel unit shown in FIG. 13.
Figure 15:
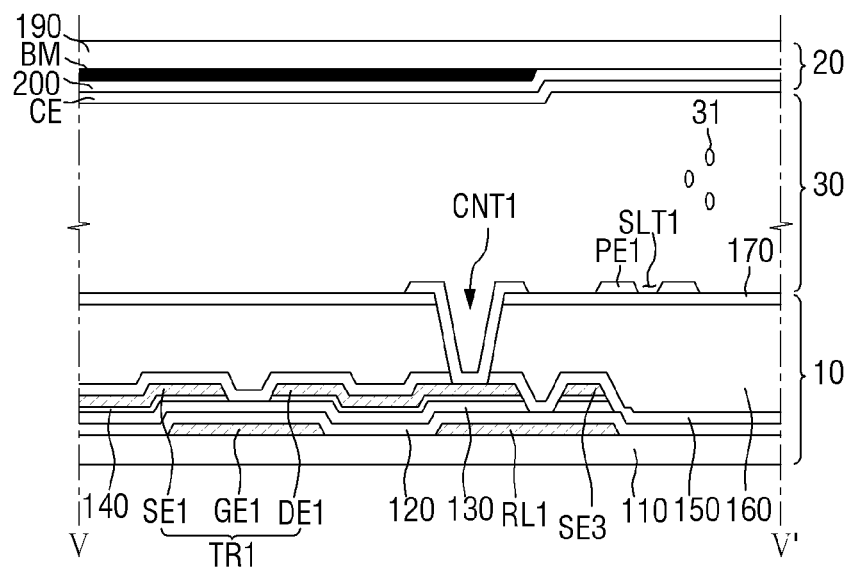
FIG. 15 is a cross-sectional view taken along line V-V' of FIG. 14.
Figure 16:
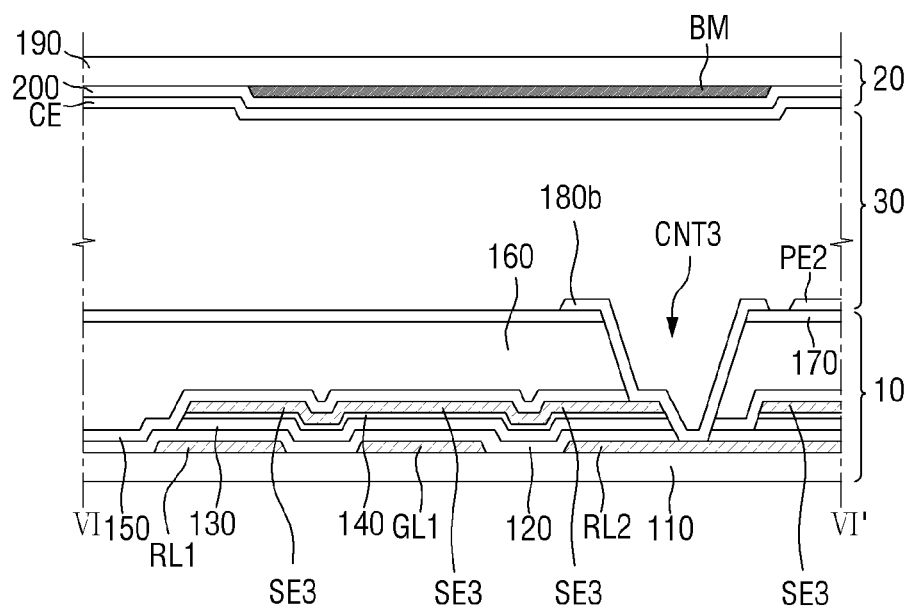
FIG. 16 is a cross-sectional view taken along line VI-VI' of FIG. 14.

FIG. 13 is an equivalent circuit diagram illustrating a first pixel unit in the configuration of an LCD device according to another exemplary embodiment of the invention. FIG. 14 is a plan view specifically illustrating the first pixel unit shown in FIG. 13. FIG. 15 is a cross-sectional view taken along line V-V' of FIG. 14. FIG. 16 is a cross-sectional view taken along line VI-VI' of FIG. 14. For convenience of explanation, the reference numerals having been used in FIGS. 1 to 9 will be used in the same manner, and the duplicated contents having been described with reference to FIGS. 1 to 9 will not be repeated.

Referring to FIGS. 13 to 16, the LCD device according to another exemplary embodiment of the invention may include a first pixel unit PX1 and a second pixel unit PX2 (refer to FIG. 8).

The first pixel unit PX1 may include a first subpixel unit SPX1 and a second subpixel unit SPX2.

The first subpixel unit SPX1 may include a first switching element TR1, a first liquid crystal capacitor Clc1, a first storage capacitor Cst1, and a first subpixel electrode PE1. The first switching element TR1 is turned on according to a first gate signal G1 received from a first gate line GL1 to provide a first data signal D1 received from the first data line DL1 to the first subpixel electrode PE1. The first liquid crystal capacitor Clc1 charges the difference voltage between a voltage provided to the first subpixel electrode PE1 and a voltage provided to the common electrode CE.

The second subpixel unit SPX2 may include a second switching element TR2, a third switching element TR3, a second liquid crystal capacitor Clc2, a second storage capacitor Cst2, and a second subpixel electrode PE2.

The second switching element TR2 is turned on according to the first gate signal G1 received from the first gate line GL1 to apply the first data signal D1 received from the first data line DL1 to the second subpixel electrode PE2.

The third switching element TR3 may be connected with the first gate line GL1, a third storage line RL3, and the second subpixel electrode PE2. The third switching element TR3 is turned on according to the first gate signal G1 received from the first gate line GL1 to apply a storage signal S received from the third storage line RL3 to the second subpixel electrode PE2.

Therefore, the second liquid crystal capacitor Clc2 charges the difference voltage between a voltage provided to the second subpixel electrode PE2 and a voltage provided to the common electrode CE, but the charged voltage is divided when the third switching element TR3 is turned on. Thus, the level of the voltage charged in the second liquid crystal capacitor Clc2 is lower than the level of the voltage charged in the first liquid crystal capacitor Clc1.

That is, in the first pixel unit PX1, since the level of the voltage charged in the first liquid crystal capacitor Clc1 is different from the level of the voltage charge in the second liquid crystal capacitor Clc2, the oblique angle of liquid crystal molecules of the first subpixel unit SPX1 is different from the oblique angle of liquid crystal molecules of the second subpixel unit SPX2. Therefore, the first subpixel unit SPX1 may be different from the second subpixel unit SPX2 in brightness.

The storage wiring RD (refer to FIG. 11) may include first to third storage lines RL1 to RL3. At least a part of the first storage line RL1 may overlap the first subpixel electrode PE1. At least a part of the second storage line RL2 may overlap the second subpixel electrode PE2. The second storage line RL2 may include a horizontal portion RL2a extending in the first direction d1 and a vertical portion RL2b extending in the second direction d2.

The third storage line RL3 may be connected with a first electrode of the third switching element TR3 through a first node N1. Further, the third storage line RL3 is connected with one of the first and second storage lines RL1 and RL2. Therefore, the third storage line RL3 is insulated from the remaining one of the first and second storage lines RL1 and RL2. In an exemplary embodiment, when the third storage line RL3 is connected with the second storage line RL2, the third storage line RL3 is insulated from the first storage line RL1. In the specification, it is exemplified that the third storage line RL3 is connected with the second storage line RL2, and is insulated from the first storage line RL1.

The third storage line RL3 may be disposed on a different layer from each of the first and second storage lines RL1 and RL2. Referring to FIGS. 15 and 16, each of the first and second storage lines RL1 and RL2 may be disposed on the same layer as that on which the first gate line GL1 is disposed. Further, the third storage line RL3 may be disposed on the same layer as that on which the first data line DL1 is disposed.

The third storage line RL3 may have the same configuration as the third source electrode SE3 of the third switching element TR3. Hereinafter, the third storage line RL3, and the third source electrode SE3 of the third switching element TR3 will be used interchangeably with each other, in some cases.

The third switching element TR3 will be described in more detail. The third source electrode SE3 of the third switching element TR3 may be connected with the second storage line RL2 through a third contact hole CNT3. More specifically, a first floating electrode 180a is provided to cover the third contact hole CNT3, so as to connect the second storage line RL2 with the third source electrode SE3 of the third switching element TR3.

Further, the third source electrode SE3 of the third switching element TR3 may overlap both the first subpixel electrode PE1 and the second subpixel electrode PE2. In an exemplary embodiment, the third source electrode SE3 of the third switching element TR3 may extend in the second direction d2 so as to cross each of the center of the first subpixel electrode PE1 and the center of the second subpixel electrode PE2. The third source electrode SE3 of the third switching element TR3 extends in the second direction d2 so as to be connected with a source electrode of a switching element located in a pixel unit region connected with the second gate line GL2 adjacent to the first gate line GL1. This configuration will be described later.

That is, in the LCD device according to another exemplary embodiment of the invention, the third storage line, that is, the third source electrode SE3 itself of the third switching element TR3 extends to overlap each of the first and second subpixel electrodes PE1 and PE2. Further, the third source electrode SE3 of the third switching element TR3 may be connected with any one of the first and second storage lines RL1 and RL2. In an exemplary embodiment, the third source electrode SE3 of the third switching element TR3 may extend to overlap each of the second stem portion PE1b of the first subpixel electrode PE1 and the second stem portion PE2b of the second subpixel electrode PE2.

Accordingly, the first and second storage lines RL1 and RL2 extending in the first direction d1 are connected with the third storage line RL3 extending in the second direction d2 to form a mesh structure. Therefore, the resistance components of the first to third storage lines RL1 to RL3 are reduced, so as to prevent an IR drop phenomenon of storage signals S provided to the third switching element TR3. The relationship between adjacent pixel units will be described with reference to FIGS. 17 and 18.

Figure 17:
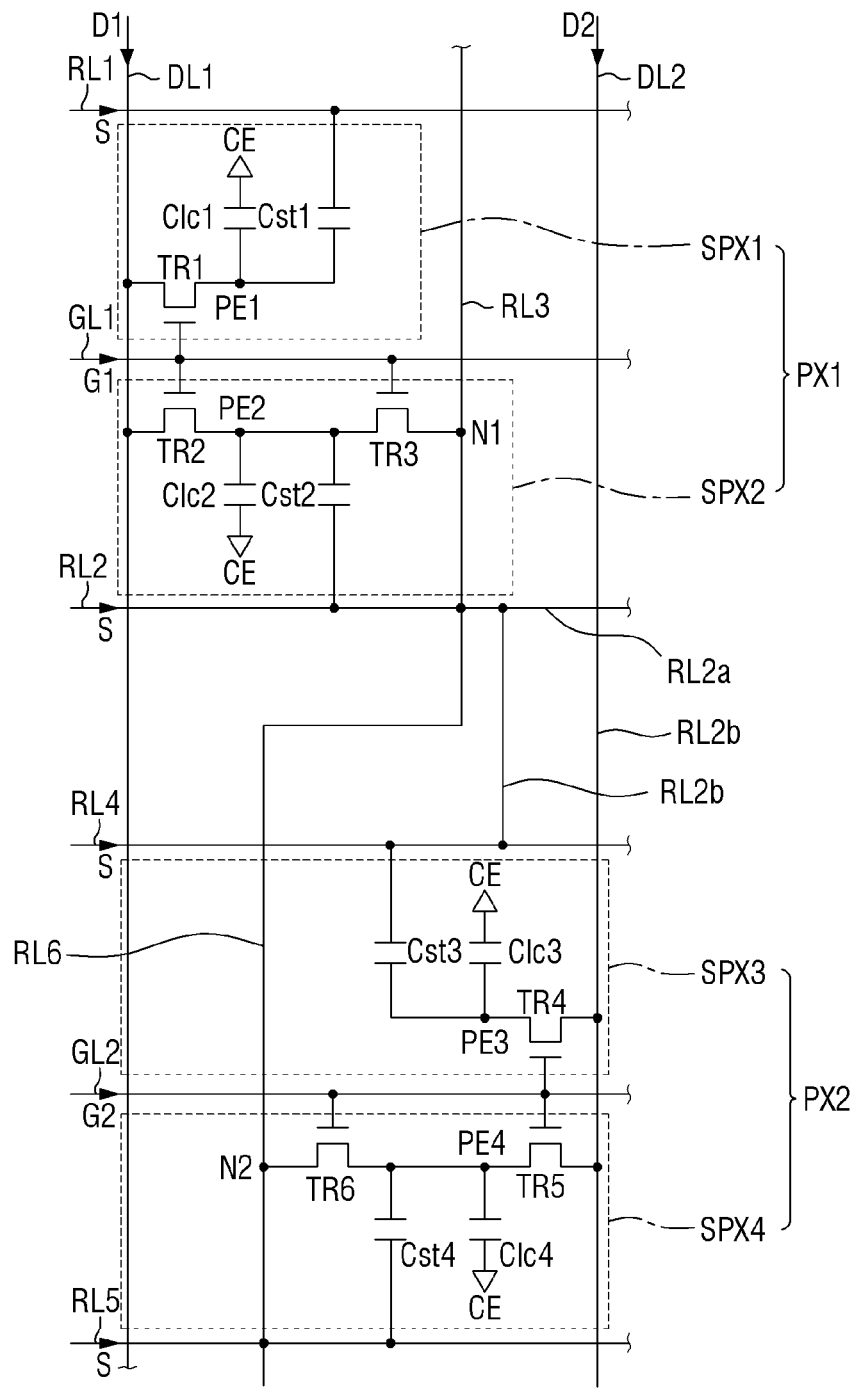
FIG. 17 is an equivalent circuit diagram illustrating the first pixel unit shown in FIG. 13 and a second pixel unit adjacent the first pixel unit.
Figure 18:
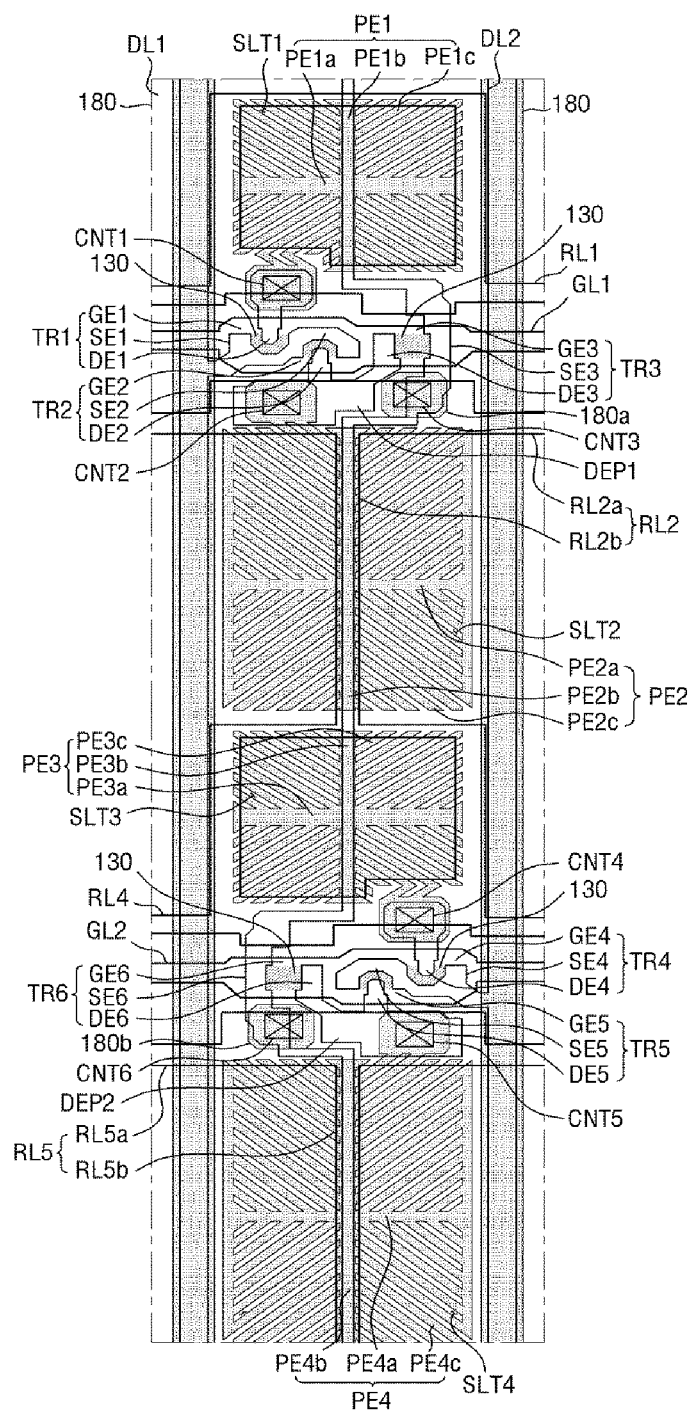
FIG. 18 is a plan view specifically illustrating the first and second pixel units shown in FIG. 17.

FIG. 17 is an equivalent circuit diagram illustrating the first pixel unit shown in FIG. 13 and a second pixel unit adjacent the first pixel unit. FIG. 18 is a plan view specifically illustrating the first and second pixel units shown in FIG. 17. However, the duplicated contents having been described with reference to FIGS. 1 to 10 and FIGS. 13 to 16 will not be repeated.

The LCD device according to another exemplary embodiment of the invention may include a first pixel unit PX1 and a second pixel unit PX2 adjacent thereto. The second pixel unit PX2 may include a third subpixel unit SPX3 and a fourth subpixel unit SPX4.

The third subpixel unit SPX3 may include a fourth switching element TR4, a third liquid crystal capacitor Clc3, a third storage capacitor Cst3, and a third subpixel electrode PE3.

The fourth source electrode SE4 of the fourth switching element TR4 may be connected with a second data line DL2, and the fourth drain electrode DE4 of the fourth switching element TR4 may be connected with the third subpixel electrode PE3. Further, the fourth gate electrode GE4 of the fourth switching element TR4 may be connected with a second gate line GL2. Thus, the fourth switching element TR4 is turned on according to a second gate signal G2 received from a second gate line GL2 to apply a second data signal D2 received from the second data line DL2 to the third subpixel electrode PE3.

The third liquid crystal capacitor Clc3 charges the difference voltage between a voltage provided to the third subpixel electrode PE3 and a voltage provided to the common electrode CE. Further, at least a part of the third subpixel electrode PE3 may overlap the fourth storage line RL4. Thus, the third subpixel unit SPX3 may include a third storage capacitor disposed between the third subpixel electrode PE3 and the fourth storage line RL4.

In an exemplary embodiment, the fourth storage line RL4 may be provided to surround the periphery of the third subpixel electrode PE3. Further, the fourth storage line RL4 may be connected with the vertical portion RL2b of the fourth storage line RL4.

The fourth subpixel unit SPX4 may include a fifth switching element TR5, a sixth switching element TR6, a fourth liquid crystal capacitor Clc4, a fourth storage capacitor Cst4, and a fourth subpixel electrode PE4.

The fifth source electrode SE5 of the fifth switching element TR5 may be connected with the second data line DL2, and the fifth drain electrode DE5 of the fifth switching element TR5 may be connected with the fourth subpixel electrode PE4. Further, the fifth gate electrode GE5 of the fifth switching element TR5 may be connected with the second gate line GL2. Thus, the fifth switching element TR5 is turned on according to the second gate signal G2 received from the second gate line GL2 to apply the second data signal D2 received from the second data line DL2 to the fourth subpixel electrode PE4.

The sixth source electrode SE6 of the sixth switching element TR6 may be connected with a sixth storage line RL6, and the sixth drain electrode DE6 of the sixth switching element TR6 may be connected with the fourth subpixel electrode PE4. Further, the sixth gate electrode GE5 of the sixth switching element TR6 may be connected with the second gate line GL2. Thus, the sixth switching element TR6 is turned on according to the second gate signal G2 received from the second gate line GL2 to apply the storage signal S received from the six storage line RL6 to the fourth subpixel electrode PE4.

Therefore, the fourth liquid crystal capacitor Clc4 charges the difference voltage between a voltage provided to the fourth subpixel electrode PE4 and a voltage provided to the common electrode CE, but the voltage charged in the fourth liquid crystal capacitor Clc4 is divided when the sixth switching element TR6 is turned on. Thus, the level of the voltage charged in the fourth liquid crystal capacitor Clc4 is lower than the level of the voltage charged in the third liquid crystal capacitor Clc3.

The fifth storage line RL5 may include a horizontal portion RL5a extending in the first direction d1 and a vertical portion RL5b extending in the second direction d2. The vertical portion RL5b of the fifth storage line RL5 may be disposed to overlap the fourth subpixel electrode PE4. The fourth and fifth storage lines RL4 and RL5 may be disposed on the same layer as that on which the first storage line RL1, the second storage line RL2, and the first gate line GL1 are disposed.

In an exemplary embodiment, the sixth storage line RL6 may be provided to be symmetrical with the third storage line RL3 based on the second direction d2.

The sixth storage line RL6 may have the same configuration as the sixth source electrode SE6 of the sixth switching element TR6. The sixth source electrode SE6 of the sixth switching element TR6 is disposed on the same layer as that on which the first data line DL1 and the second data line DL2 are disposed, and thus the sixth storage line RL6 may be disposed on the different layer from that on which the fourth and fifth storage lines RL4 and RL5 are disposed. Hereinafter, the sixth storage line RL6, and the sixth source electrode SE6 of the sixth switching element TR6 will be used interchangeably with each other, in some cases.

The sixth switching element TR6 will be described in more detail. The sixth source electrode SE6 of the sixth switching element TR6 may be connected with the fifth storage line RL5 through a sixth contact hole CNT6. More specifically, a second floating electrode 180b is provided to cover the sixth contact hole CNT6, so as to connect the fifth storage line RL5 with the sixth source electrode SE6 of the sixth switching element TR6.

Further, the sixth source electrode SE6 of the sixth switching element TR6 may overlap both the third subpixel electrode PE3 and the fourth subpixel electrode PE4. In an exemplary embodiment, the sixth source electrode SE6 of the sixth switching element TR6 may extend in the second direction d2 so as to cross each of the center of the third subpixel electrode PE3 and the center of the fourth subpixel electrode PE4.

That is, in the LCD device according to another exemplary embodiment of the invention, the third storage line, that is, the third source electrode SE3 itself of the third switching element TR3 extends to overlap each of the first and second subpixel electrodes PE1 and PE2 in the region of the first pixel unit PX1. Further, the sixth storage line, that is, the sixth source electrode SE6 itself of the sixth switching element TR6 extends to overlap each of the third and fourth subpixel electrodes PE3 and PE4 in the region of the second pixel unit PX2.

Moreover, the third source electrode SE3 of the third switching element TR3 may be connected with any one of the first and second storage lines RL1 and RL2, and the sixth source electrode SE6 of the sixth switching element TR6 may be connected with any one of the third and fourth storage lines RL3 and RL2.

Accordingly, the first storage line RL1, the second storage line RL2, the fourth storage line RL4, and the fifth storage line RL5, which extend in the first direction d1, are connected with the third and sixth storage lines RL3 and RL6, which extend in the second direction d2, to form a mesh structure. Therefore, the resistance components of the first to sixth storage lines RL1 to RL6 are reduced, so as to prevent an IR drop phenomenon of storage signals S provided to the third and sixth switching elements TR3 and TR6.

Although not shown in the drawings, the first and second pixel units PX1 and PX2 display a blue color, for example.

Figure 19:
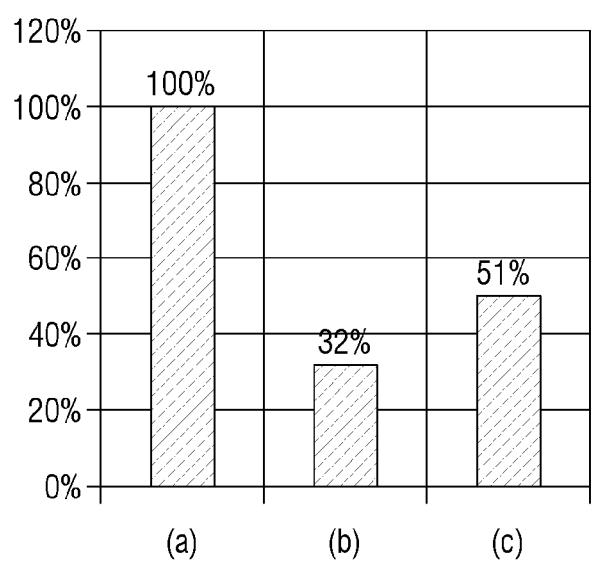
FIG. 19 is a graph for explaining an exemplary embodiment of the effects of the LCD device according to the invention.

FIG. 19 is a graph for explaining the effects of the LCD device according to an exemplary embodiment of the invention. The horizontal axis of the graph shown in FIG. 19 shows the IR drop ratios of storage signals represented by percentage. In the vertical axis of the graph, (a) shows a conventional LCD device, (b) shows an LCD device having a first pixel unit PX1 (refer to FIG. 2) according to an exemplary embodiment of the invention, and (c) shows an LCD device having a first pixel unit PX1 (refer to FIG. 2) displaying a blue color according to an exemplary embodiment of the invention.

Referring to FIG. 19, when the IR drop ratio of storage signals of the conventional LCD device is set to 100, in the case of (c), it may be seen that the IR drop ratio of storage signals thereof is reduced to an approximately half of the IR drop ratio of storage signals of the conventional LCD device, and in the case of (c), it may be seen that the IR drop ratio of storage signals thereof is reduced to approximately 67% of the IR drop ratio of storage signals of the conventional LCD device.

The effect of improving the planar horizontal crosstalk of the LCD device according to an exemplary embodiment of the invention will be described with reference to Table below.

Referring to Table, it may be seen that the planar horizontal crosstalk (−0.5%) of the LCD device having a first pixel unit PX1 (refer to FIG. 2) according to an exemplary embodiment of the invention is reduced approximately 83%, compared to the planar horizontal crosstalk (−2.96%) of the conventional LCD device.

TABLE

| Unit: % | Conventional LCD device | LCD device according to the invention |
|---|---|---|
| Planar horizontal crosstalk (quantitized) | −2.96% | −0.5% |

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:
1. A liquid crystal display device, comprising:
 a first subpixel electrode;
 a second subpixel electrode;
 a storage wiring comprising a first storage line which overlaps the first subpixel electrode and a second storage line which overlaps the second subpixel electrode;
 a first transistor comprising a first electrode which is connected with both the first storage line and the second storage line.
2. The liquid crystal display device of claim 1, wherein the first and second storage lines are disposed on the different layer from that on which the first electrode of the first transistor is disposed.
3. The liquid crystal display device of claim 1, wherein the first storage line surrounds the first subpixel electrode.
4. The liquid crystal display device of claim 1, wherein the second storage line includes a horizontal portion extending in a first direction and a vertical portion extending in a second direction different from the first direction.
5. The liquid crystal display device of claim 1, further comprising:
 a gate line which is connected a control electrode of the first transistor TR3; and
 a data line which is disposed on the gate line.
6. The liquid crystal display device of claim 5, further comprising:
 a second transistor TR1 includes a control electrode which is connected with the gate line, a first electrode which is connected with the data line and a second electrode which is connected with the first subpixel electrode; and
 the third transistor TR2 includes a control electrode which is connected with the gate line, a first electrode which is connected with the data line and a second electrode which is connected with the second subpixel electrode.
7. The liquid crystal display device of claim 6, wherein the first transistor TR1 further includes a control electrode which is connected with the gate line and a second electrode which is connected with the second subpixel electrode.
8. The liquid crystal display device of claim 5, wherein the first and second storage lines are disposed on the same layer as that on which the gate line is disposed.

9. The liquid crystal display device of claim 5,
wherein the gate line extends in a first direction and the data line extends in a second direction different from the first direction, and the first electrode of the first transistor extends in the second direction.

\* \* \* \* \*